(12) United States Patent
Emerson et al.

(10) Patent No.: US 9,111,778 B2
(45) Date of Patent: Aug. 18, 2015

(54) LIGHT EMITTING DIODE (LED) DEVICES, SYSTEMS, AND METHODS

(75) Inventors: David T. Emerson, Chapel Hill, NC (US); Michael J. Bergmann, Chapel Hill, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 304 days.

(21) Appl. No.: 13/011,609

(22) Filed: Jan. 21, 2011

(65) Prior Publication Data

US 2012/0153317 A1 Jun. 21, 2012

Related U.S. Application Data

(63) Continuation-in-part of application No. 12/969,267, filed on Dec. 15, 2010, now Pat. No. 8,686,445.

(51) Int. Cl.
*H01L 33/08* (2010.01)
*H01L 25/075* (2006.01)
(Continued)

(52) U.S. Cl.
CPC ...... *H01L 25/0753* (2013.01); *G02F 1/133603* (2013.01); *G02F 1/133608* (2013.01); *H01L 24/48* (2013.01); *H01L 33/486* (2013.01); *H01L 33/60* (2013.01); *H01L 33/62* (2013.01); *H01L 33/642* (2013.01); *H01L 2224/2929* (2013.01); *H01L 2224/29144* (2013.01); *H01L 2224/29399* (2013.01); *H01L 2224/48091* (2013.01); *H01L 2224/48247* (2013.01); *H01L 2224/83192* (2013.01); *H01L 2224/92247* (2013.01);
(Continued)

(58) Field of Classification Search
CPC .......... H01L 2224/48091; H01L 2924/01322; H01L 33/60; H01L 33/486; H01L 2224/29111; H01L 33/642; H01L 33/405; H01L 33/52; H01L 2924/14
USPC ................... 257/88, 89, 98, E23.055; 438/28
See application file for complete search history.

(56) References Cited

U.S. PATENT DOCUMENTS 4,946,547 A    8/1990 Palmour
5,200,022 A    4/1993 Kong
(Continued)

FOREIGN PATENT DOCUMENTS

CN    101142692 A    3/2008
CN    201054361       4/2008
(Continued)

OTHER PUBLICATIONS

Non-Final Office Action for Korean Application Serial No. KR 30-2010-0047048 dated Dec. 15, 2011.
(Continued)

*Primary Examiner* — Roy Potter
(74) *Attorney, Agent, or Firm* — Jenkins, Wilson, Taylor & Hunt, P.A.

(57) ABSTRACT

Light emitting diode (LED) devices, systems, and methods are disclosed. In one aspect, an illumination panel can be configured to provide backlighting for a liquid crystal display (LCD) panel. The illumination panel can include one or more LEDs arranged in an array. The one or more LEDs can be attached using metal-to-metal die attach methods over an illumination panel, or attached within packages disposed over the illumination panel. In one aspect, the one or more LEDs can be attached using robust metal-to-metal die attach techniques and/or materials disclosed herein.

126 Claims, 15 Drawing Sheets

(51) Int. Cl.
*G02F 1/1335* (2006.01)
*H01L 23/00* (2006.01)
*H01L 33/48* (2010.01)
*H01L 33/60* (2010.01)
*H01L 33/62* (2010.01)
*H01L 33/64* (2010.01)

(52) U.S. Cl.
CPC ............... *H01L2924/00014* (2013.01); *H01L 2924/01019* (2013.01); *H01L 2924/01079* (2013.01); *H01L 2924/01322* (2013.01); *H01L 2924/10157* (2013.01); *H01L 2924/10158* (2013.01)

(56) References Cited

U.S. PATENT DOCUMENTS

| | | |
|---|---|---|
| 5,210,051 A | 5/1993 | Carter, Jr. |
| RE34,861 E | 2/1995 | Davis et al. |
| 5,393,993 A | 2/1995 | Edmond |
| 5,506,446 A | 4/1996 | Hoffman et al. |
| 5,523,589 A | 6/1996 | Edmond |
| 6,274,924 B1 | 8/2001 | Carey et al. |
| 6,498,355 B1 | 12/2002 | Harrah |
| 6,806,583 B2 | 10/2004 | Koay et al. |
| 6,828,170 B2 | 12/2004 | Roberts et al. |
| 6,921,927 B2 | 7/2005 | Ng et al. |
| 6,936,855 B1 | 8/2005 | Harrah |
| 6,949,771 B2 | 9/2005 | Yoganandan et al. |
| 7,098,483 B2 | 8/2006 | Mazzochette et al. |
| 7,253,448 B2 | 8/2007 | Roberts et al. |
| 7,361,940 B2 | 4/2008 | Kim et al. |
| 7,566,159 B2 | 7/2009 | Oon et al. |
| D597,968 S | 8/2009 | Kobayakawa et al. |
| 7,592,638 B2 | 9/2009 | Kim |
| 7,659,551 B2 | 2/2010 | Loh |
| 7,692,206 B2 | 4/2010 | Loh |
| D622,680 S | 8/2010 | Lin et al. |
| 7,791,061 B2 | 9/2010 | Edmond et al. |
| D626,095 S | 10/2010 | Hsieh |
| D627,310 S | 11/2010 | Lin et al. |
| D628,541 S | 12/2010 | Lin |
| 7,852,015 B1 | 12/2010 | Yen et al. |
| 7,858,993 B2 | 12/2010 | Kong et al. |
| D632,267 S | 2/2011 | Chen et al. |
| D632,659 S | 2/2011 | Hsieh |
| D634,284 S | 3/2011 | Ko et al. |
| D634,285 S | 3/2011 | Ko et al. |
| D634,286 S | 3/2011 | Ko et al. |
| D634,716 S | 3/2011 | Suzuki |
| D641,719 S | 7/2011 | Hussell et al. |
| D643,819 S | 8/2011 | Joo |
| D648,686 S | 11/2011 | Hussell et al. |
| D648,687 S | 11/2011 | Joo et al. |
| D658,599 S | 5/2012 | Takahashi et al. |
| D659,657 S | 5/2012 | Hussell et al. |
| D661,264 S | 6/2012 | Joo et al. |
| D667,801 S | 9/2012 | Joo et al. |
| 8,269,244 B2 | 9/2012 | Hussell |
| 8,354,992 B2 * | 1/2013 | Rumreich et al. ............ 345/102 |
| D679,842 S | 4/2013 | Joo et al. |
| 8,497,522 B2 | 7/2013 | Hussell |
| 8,598,602 B2 | 12/2013 | Hussell |
| 8,610,140 B2 | 12/2013 | Joo |
| 8,648,359 B2 | 2/2014 | Hussell |
| 8,686,445 B1 | 4/2014 | Hussell et al. |
| D704,358 S | 5/2014 | Joo et al. |
| D708,156 S | 7/2014 | Joo et al. |
| 2001/0045640 A1 | 11/2001 | Oida et al. |
| 2004/0075100 A1 | 4/2004 | Bogner et al. |
| 2004/0079957 A1 | 4/2004 | Andrews et al. |
| 2004/0087057 A1 | 5/2004 | Wang et al. |
| 2005/0269587 A1 | 12/2005 | Loh et al. |
| 2006/0043401 A1 | 3/2006 | Lee et al. |
| 2006/0118808 A1 | 6/2006 | Sadamu et al. |
| 2006/0157726 A1 | 7/2006 | Loh et al. |
| 2006/0186418 A1 | 8/2006 | Edmond et al. |
| 2007/0052074 A1 | 3/2007 | Hasegawa |
| 2007/0057364 A1 | 3/2007 | Wang et al. |
| 2007/0114514 A1 | 5/2007 | Shin |
| 2007/0262328 A1 | 11/2007 | Bando |
| 2008/0023722 A1 | 1/2008 | Lee et al. |
| 2008/0048201 A1 | 2/2008 | Kim et al. |
| 2008/0185605 A1 | 8/2008 | Wada et al. |
| 2008/0258130 A1 | 10/2008 | Bergmann et al. |
| 2008/0278941 A1 | 11/2008 | Logan et al. |
| 2008/0283849 A1 | 11/2008 | Imai |
| 2009/0008662 A1 | 1/2009 | Ashdown et al. |
| 2009/0101921 A1 | 4/2009 | Lai |
| 2009/0121249 A1 | 5/2009 | Tseng et al. |
| 2009/0122533 A1 * | 5/2009 | Brukilacchio ................ 362/231 |
| 2009/0159905 A1 | 6/2009 | Chen |
| 2009/0267085 A1 | 10/2009 | Lee et al. |
| 2009/0321779 A1 | 12/2009 | Chang et al. |
| 2010/0059783 A1 | 3/2010 | Chandra |
| 2010/0102345 A1 | 4/2010 | Sung et al. |
| 2010/0155748 A1 | 6/2010 | Chan et al. |
| 2010/0163887 A1 | 7/2010 | Kim et al. |
| 2010/0181582 A1 | 7/2010 | Li et al. |
| 2010/0210048 A1 | 8/2010 | Urano |
| 2010/0237360 A1 | 9/2010 | Kao et al. |
| 2010/0270577 A1 | 10/2010 | Rulkens et al. |
| 2011/0006658 A1 | 1/2011 | Chan |
| 2011/0090711 A1 | 4/2011 | Kim |
| 2011/0180827 A1 | 7/2011 | Hussell |
| 2011/0186873 A1 | 8/2011 | Emerson |
| 2011/0316022 A1 | 12/2011 | Hussell |
| 2012/0069560 A1 | 3/2012 | Miskin et al. |
| 2012/0127720 A1 | 5/2012 | Hussell et al. |
| 2012/0307481 A1 | 12/2012 | Joo et al. |
| 2013/0003375 A1 | 1/2013 | Hussell |
| 2013/0011946 A1 | 1/2013 | Hussell |
| 2014/0027801 A1 | 1/2014 | Hussell |
| 2014/0159088 A1 | 6/2014 | Hussell et al. |
| 2014/0217434 A1 | 8/2014 | Hussell et al. |

FOREIGN PATENT DOCUMENTS

| | | |
|---|---|---|
| CN | 101432896 | 5/2009 |
| CN | 101765627 A | 6/2010 |
| CN | 200930286397.5 | 10/2010 |
| CN | ZL 2011-30010728 | 1/2012 |
| CN | ZL201130171313.0 | 4/2012 |
| EP | 1 756 879 | 1/2009 |
| EP | 001242234 | 1/2011 |
| EP | 2 438 631 | 4/2012 |
| EP | 2 603 930 | 6/2013 |
| EP | 2 628 196 | 8/2013 |
| JP | D1102760 | 3/2001 |
| JP | 2009-016636 | 1/2002 |
| JP | 2002-280616 | 9/2002 |
| JP | 2005-179147 | 7/2005 |
| JP | 2005-209763 | 8/2005 |
| JP | 2006-093470 WO | 4/2006 |
| JP | 2006-173561 | 6/2006 |
| JP | 2007-108547 | 4/2007 |
| JP | 2007-335762 | 12/2007 |
| JP | 2008-071954 | 3/2008 |
| JP | 2008-091792 | 4/2008 |
| JP | 2008-098218 | 4/2008 |
| JP | 2008-103480 | 5/2008 |
| JP | 2008-147611 | 6/2008 |
| JP | 2008-533716 | 8/2008 |
| JP | 2008-545269 | 12/2008 |
| JP | D1346959 | 12/2008 |
| JP | 3154368 | 9/2009 |
| JP | 2010-034262 | 2/2010 |
| JP | 2010-205776 | 9/2010 |
| JP | 1416396 | 5/2011 |
| JP | 1431637 | 12/2011 |
| JP | 1433335 | 1/2012 |
| JP | D1433030 | 1/2012 |
| JP | 1441805 | 4/2012 |
| KR | 10-0591687 | 6/2006 |

(56) References Cited

FOREIGN PATENT DOCUMENTS

| | | |
|---|---|---|
| KR | 1020070000130 A | 1/2007 |
| KR | 10-2007-0055361 | 5/2007 |
| KR | 10-0845856 | 7/2008 |
| KR | 1020090003378 A | 1/2009 |
| KR | 10-0967451 | 7/2010 |
| KR | 30-0681227 | 2/2013 |
| KR | 30-0697636 | 6/2013 |
| TW | 200711166 | 3/2007 |
| TW | 200928203 | 7/2009 |
| TW | M376909 | 3/2010 |
| TW | 201013969 | 4/2010 |
| TW | M383822 | 7/2010 |
| TW | 100305347 | 3/2012 |
| TW | D146222 | 4/2012 |
| TW | D148144 | 7/2012 |
| WO | WO 2006/059828 | 6/2006 |
| WO | WO 2006/095949 | 9/2006 |
| WO | WO 2007/126720 | 11/2007 |
| WO | WO 2008/002088 | 1/2008 |
| WO | WO 2008/021268 | 2/2008 |
| WO | WO 2008/069204 | 6/2008 |
| WO | WO-2010/141215 | 3/2011 |
| WO | WO 2012/005984 | 1/2012 |
| WO | WO 2012/021238 | 2/2012 |
| WO | WO 2012/050994 | 4/2012 |
| WO | WO 2012/100060 | 7/2012 |
| WO | WO 2012/106312 | 8/2012 |
| WO | WO 2012/109225 | 8/2012 |
| WO | WO 2012/151270 | 11/2012 |

OTHER PUBLICATIONS

Non-Final Office Action for Korean Application Serial No. KR 30-2010-0047049 dated Dec. 15, 2011.
Notification of Grant for Chinese Application Serial CN 2011/30210595.0 dated Jan. 17, 2012.
Notification of Grant for Chinese Application Serial No. CN 2010-305787293.2 dated Jan. 19, 2012.
Notice of Allowance for U.S. Appl. No. 29/401,692 dated Jan. 20, 2012.
Notice of Allowance for U.S. Appl. No. 29/403,433 dated Feb. 2, 2012.
International Search Report for Application Serial No. TW 100305347 dated Mar. 5, 2012.
Japanese Notice of Allowance for Application Serial No. JP 2011-017747 dated Mar. 13, 2012.
Communication of European publication number and information on the application of Article 67(3) EPC dated Mar. 14, 2012.
Non-Final Office Action for U.S. Appl. No. 13/082,699 dated Apr. 13, 2012.
Notice of Allowance for U.S. Appl. No. 29/397,017 dated May 17, 2012.
Notice of Allowance for U.S. Appl. No. 12/853,812 dated May 21, 2012.
International Search Report and Written Opinion for Application Serial No. PCT/US2011/054560 dated May 22, 2012.
Supplemental Notice of Allowance for U.S. Appl. No. 29/397,017 dated Jul. 23, 2012.
Hyun-Ho Kim et al., Thermal Transient Characteristics of Die Attach in High Power LED PKG, Microelectronics Reliability, vol. 48, Issue 3, Mar. 2008, pp. 445-454.
Notice of Allowance from U.S. Appl. No. 29/330,657 dated Sep. 25, 2009.
Taiwanese Notice of Allowance for Application No. 100305347 dated Mar. 23, 2012.
Certificate of Design Patent for Chinese Application Serial No. CN ZL 201130171313 dated May 7, 2012.
Certificate of Design Patent for Application Serial No. CN ZL 201130210595 dated Jun. 11, 2012.
Certificate of Design Patent for Application Serial No. CN ZL 201030577293 dated May 23, 2012.
International Search Report for Application Serial No. PCT/US2012/023285 dated Jun. 27, 2012.
Korean Office Action for Application Serial No. KR 30-2011-27243 dated Jul. 5, 2012.
Korean Office Action for Application Serial No. KR 30-2011-27244 dated Jul. 5, 2012.
Korean Office Action for Application Serial No. KR 30-2011-27245 dated Jul. 5, 2012.
International Search Report and Written Opinion for Application Serial No. PCT/US2012/024122 dated Jul. 11, 2012.
Restriction Requirement for U.S. Appl. No. 29/382,394 dated Jul. 17, 2012.
Notification Concerning Availability of The Publication Serial No. PCT/US2012/023285 dated Aug. 9, 2012.
Notification Concerning Availability of The Publication Serial No. PCT/US2012/024122 dated Aug. 16, 2012.
Korean Office Action for Application Serial No. KR 30-2010-0047049 dated Sep. 12, 2012.
International Search Report and Written Opinion for Application Serial No. PCT/US2012/021879 dated Sep. 21, 2012.
International Search Report and Written Opinion for Application Serial No. PCT/US2012/036110 dated Oct. 4, 2012.
Notice of Allowance for U.S. Appl. No. 13/082,699 dated Oct. 23, 2012.
Korean Decision to Grant for Application No. KR 30-2011-0027245 dated Nov. 19, 2012.
Korean Decision to Grant for Application No. KR 30-2011-0027244 dated Nov. 19, 2012.
Korean Decision to Grant for Application No. KR 30-2011-0027243 dated Nov. 26, 2012.
Korean Decision to Grant for Application No. KR 30-2010-0047048 dated Nov. 26, 2012.
Notice of Allowance for U.S. Appl. No. 29/382,394 dated Nov. 27, 2012.
Supplemental Notice of Allowance for U.S. Appl. No. 29/382,394 dated Jan. 14, 2013.
Non-Final Office Action for U.S. Appl. No. 13/462,450 dated Jan. 15, 2013.
Non-Final Office Action for U.S. Appl. No. 12/825,075 dated Feb. 1, 2013.
Non-Final Office Action for U.S. Appl. No. 13/227,961 dated Mar. 26, 2013.
Non-Final Office Action for U.S. Appl. No. 12/969,267 dated Mar. 29, 2013.
Notice of Allowance for U.S. Appl. No. 13/082,699 dated Apr. 3, 2013.
Korean Notice of Allowance for Application No. 30-2010-0047049 dated Apr. 4, 2013.
Non-Final Office Action for U.S. Appl. No. 13/362,683 dated Sep. 9, 2013.
Notice of Allowance for U.S. Appl. No. 29/432,988 dated Sep. 10, 2013.
Restriction Requirement for U.S. Appl. No. 29/451,761 dated Sep. 25, 2013.
Notice of Allowance for U.S. Appl. No. 13/227,961 dated Oct. 2, 2013.
Notice of Allowance for U.S. Appl. No. 12/969,267 dated Oct. 2, 2013.
Non-Final Office Action for U.S. Appl. No. 13/616,759 dated Oct. 10, 2013.
Non-Final Office Action for U.S. Appl. No. 13/616,759 dated Jul. 11, 2013.
Notice of Allowance for U.S. Appl. No. 12/825,075 dated Jul. 31, 2013.
Notice of Allowance for U.S. Appl. No. 13/462,450 dated Aug. 1, 2013.
Extended European Search Report for Application No. EP 10 78 3782 dated Nov. 22, 2013.
Restriction Requirement for U.S. Appl. No. 13/953,438 dated Dec. 5, 2013.
Japanese Office Action for Application No. 2012-513966 dated Dec. 9, 2013.

(56) References Cited

OTHER PUBLICATIONS

Notice of Allowance for U.S. Appl. No. 29/451,761 dated Dec. 11, 2013.
Description Model No. NS6x083x issued by Nichia Corporation—at least as early as Feb. 17, 2007.
Description Model No. NS6G083 issued by Nichia Corporation—at least as early as Aug. 31, 2007.
Notice of Allowance dated Apr. 16, 2010 from U.S. Appl. No. 29/338,186.
Design U.S. Appl. No. 29/360,791, filed Apr. 30, 2010.
Non-Final Office Action for U.S. Appl. No. 12/479,318 dated Jun. 2, 2010.
Related Design U.S. Appl. No. 29/365,939, filed Jul. 16, 2010.
U.S. Appl. No. 12/853,812 filed Aug. 10, 2010.
Notice of Allowance for U.S. Appl. No. 29/353,652 dated Aug. 24, 2010.
U.S. Appl. No. 61/404,985, filed Oct. 13, 2010.
Non-final Office Action for U.S. Appl. No. 12/479,318 dated Nov. 10, 2010.
Notice of Allowance for U.S. Appl. No. 29/353,652 dated Nov. 26, 2010.
Supplemental Notice of Allowance for U.S. Appl. No. 29/353,652 dated Dec. 8, 2010.
U.S. Appl. No. 12/969,267, filed Dec. 15, 2010.
Notice of Allowance for U.S. Appl. No. 29/360,791 dated Dec. 22, 2010.
Notice of Allowance for U.S. Appl. No. 29/365,939 dated Dec. 27, 2010.
Related Design U.S. Appl. No. 29/382,394, filed Jan. 3, 2011.
International Search Report/Written Opinion dated Jan. 5, 2011 for PCT/US2010/035379.
Certificate of Registration for Community Design Application Serial No. 001283600-0001-0003 dated Jan. 7, 2011.
U.S. Appl. No. 13/011,609, filed Jan. 21, 2011.
Supplemental Notice of Allowance for U.S. Appl. No. 29/360,791 dated Jan. 24, 2011.
Notice of Allowance for U.S. Appl. No. 12/479,318 dated Feb. 17, 2011.
Notice of Allowance for U.S. Appl. No. 29/338,186 dated Mar. 10, 2011.
Notice of Allowance for Japanese Design Appl. No. 2010-026186 dated Mar. 29, 2011.
Supplemental Notice of Allowability for U.S. Appl. No. 12/479,318 dated Apr. 5, 2011.
Japanese Office Action for JP2010-026185 dated Apr. 5, 2011.
Notice of Allowance for Design U.S. Appl. No. 29/360,791 dated Apr. 12, 2011.
Notice of Allowance for Design U.S. Appl. No. 29/365,939 dated Apr. 12, 2011.
Supplemental Notice of Allowance for Design U.S. Appl. No. 29/338,186 dated May 20, 2011.
Taiwanese Office Action for Appl. No. 099305566 dated Jul. 12, 2011.
Notice of Allowance for Design U.S. Appl. No. 29/360,791 dated Jul. 21, 2011.
Notice of Allowance for Design U.S. Appl. No. 29/380,549 dated Jul. 28, 2011.
Office Action with Restriction/Election Requirement for U.S. Appl. No. 12/853,812 dated Sep. 22, 2011.
International Search Report and Written Opinion for PCT Application Serial No. PCT/US2011/41833 dated Oct. 24, 2011.
International Search Report and Written Opinion for PCT Application Serial No. PCT/US2011/043539 dated. Oct. 28, 2011.
Notice of Allowance for Japanese Application Serial No. JP-DES 2011/015199 dated Nov. 10, 2011.
Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
Non-Final Office Action for U.S. Appl. No. 12/853,812 dated Dec. 7, 2011.
International Preliminary Report on Patentability for PCT Application Serial No. PCT/US2010/035379 dated Dec. 8, 2011.
Notice of Allowance for U.S. Appl. No. 29/397,017 dated Dec. 9, 2011.
Taiwanese Office Action for Application No. 100137044 dated Jul. 16, 2014.
Chinese Office Action for Application No. 201180041213.3 dated Aug. 4, 2014.
Chinese Office Action for Application No. 201080030486.3 dated Sep. 3, 2014.
Korean Office Action for Application No. 10-2013-7022968 dated Sep. 19, 2014.
Notice of Allowance for U.S. Appl. No. 13/953,438 dated May 13, 2014.
Japanese Office Action for Application No. 2012-513966 dated May 16, 2014.
Final Office Action for U.S. Appl. No. 13/362,683 dated Jun. 5, 2014.
Notice of Allowance for U.S. Appl. No. 13/019,812 dated Jun. 12, 2014.
Taiwanese Office Action for Application No. 100126672 dated Jun. 18, 2014.
Notice of Allowance for U.S. Appl. No. 13/616,759 dated Jul. 2, 2014.
Taiwanese Office Action and Search Report for Application No. 100126672 dated Dec. 26, 2013.
Chinese Office Action for Application No. 2010800304863 dated January 27, 2014.
Taiwanese Office Action for Application No. 101102722 dated Jan. 28, 2014.
Corrected Notice of Allowance for U.S. Appl. No. 12/969,267 dated Feb. 27, 2014.
Chinese Office Action for Application No. 201080030486.3 dated Mar. 11, 2014.
Japanese Office Action for Application No. 2013-533875 dated Mar. 11, 2014.
Korean Office Action for Application No. 10-2012-7031924 dated Mar. 17, 2014.
Final Office Action for U.S. Appl. No. 13/019,812 dated Mar. 27, 2014.
Taiwanese Office Action and Search Report for Application No. 101102722 dated Oct. 23, 2014.
Korean Office Action for Application No. 10 2013/7031905 dated Sep. 29, 2014.
Chinese Office Action for Application No. 2010/80030486.3 dated Dec. 17, 2014.
Chinese Decision to Grant for Application No. 201080030486.3 Dated Apr. 1, 2015.
Chinese Office Action for Application No. 201180043373.1 dated Mar. 2, 2015.
Chinese Office Action for Application No. 201180041213.3 dated Apr. 7, 2015.
Chinese Office Action for Application No. 201210068676.5 dated Feb. 15, 2015.
Chinese Office Action for Application No. 201280014461.3 dated Jan. 4, 2015.
Chinese Office Action for Application No. 201180029228.8 dated Jan. 12, 2015.
Taiwanese Office Action for Application No. 100137044 dated Feb. 24, 2015.

\* cited by examiner

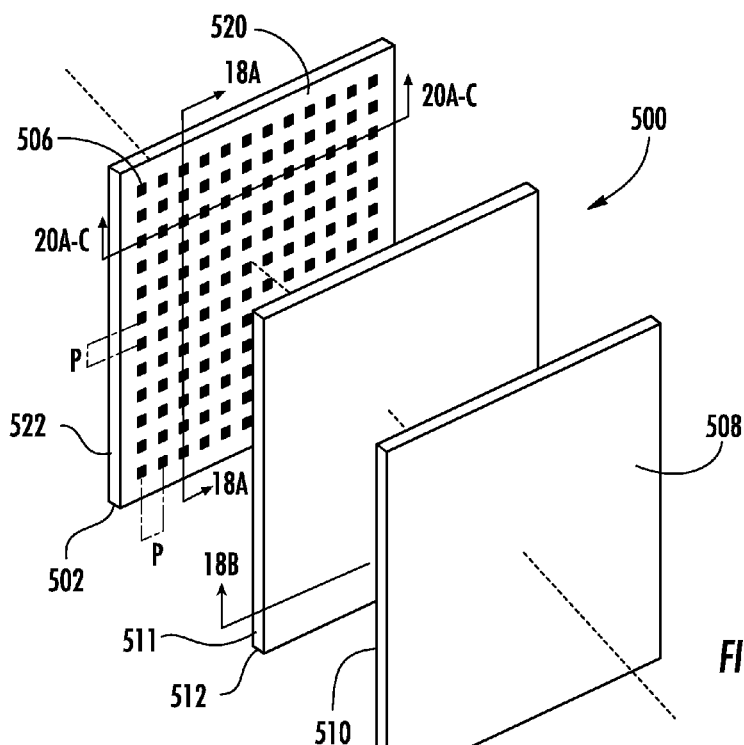
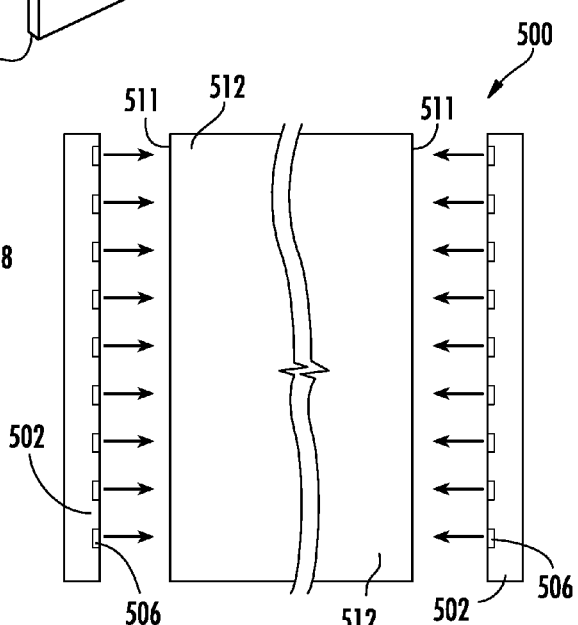
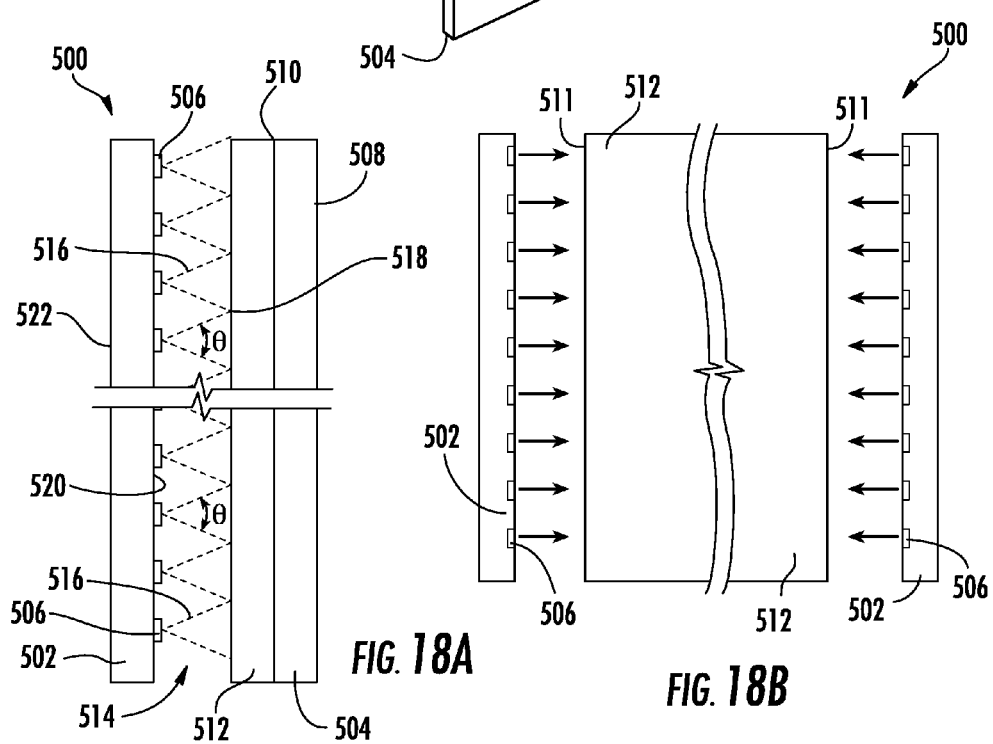
FIG. 17
FIG. 18A
FIG. 18B

LIGHT EMITTING DIODE (LED) DEVICES, SYSTEMS, AND METHODS

CROSS REFERENCE TO RELATED APPLICATIONS

This application is a continuation-in-part of and claims benefit and priority to U.S. Utility patent application Ser. No. 12/969,267, filed Dec. 15, 2010, to U.S. Utility patent application Ser. No. 12/479,318, filed Jun. 5, 2009, and to U.S. Design patent application Ser. No. 29/353,652, filed Jan. 12, 2010, the entire contents of which are incorporated by reference herein.

TECHNICAL FIELD

The subject matter herein relates generally to light emitting diode (LED) devices, systems, and methods. More particularly, the subject matter herein relates to metal to metal die attach for LED devices, systems and methods.

BACKGROUND

Solid state light sources, such as light emitting diodes (LEDs) are widely used in flat display panels for monitors, televisions, and/or other displays. LEDs can be used in the design of thinner, energy-saving backlighting systems for use with liquid crystal display (LCD) devices. Backlighting and/or other display panel systems using LEDs require less power to meet the brightness specifications for backlighting applications, thereby significantly reducing energy consumption and the need for active cooling systems. Conventional backlighting displays typically include an illumination panel wherein one or more LEDs are bonded within component packages, and the packages can then be mounted to the panel. Conventional LED packages used in backlighting systems can comprise LEDs bonded within respective packages using silicone or non-metallic epoxies. LEDs attached in backlighting displays using conventional die attach materials can become at least partially detached from the package during operation or experience squeeze out of the bonding materials. Such defects can lead to light failure and/or thermal breakdown of the LEDs during operation.

Despite the availability of various backlighting and/or display panels in the marketplace, a need remains for more robust metal-to-metal die attach techniques and materials in backlighting for providing optimized die attach with a lower thermal resistance and enhanced reliability.

SUMMARY

The present subject matter relates to light emitting diode (LED) devices, systems, and methods. In one aspect, the subject matter herein relates to die attach used in LED devices, systems, and methods for providing a more robust die attach bond resulting in fewer defects and/or detachment of LEDs, such as for use in backlighting devices and systems.

It is, therefore, an object of the present disclosure to provide improved LED devices, systems, and methods. These and other objects of the present disclosure as can become apparent from the disclosure herein are achieved, at least in whole or in part, by the subject matter described herein.

BRIEF DESCRIPTION OF THE DRAWINGS

FIG. 17 illustrates a backlighting system according to the present subject matter;

FIGS. 18A and 18B illustrate side views of a backlighting system according to the present subject matter;

DETAILED DESCRIPTION

Figure 1:
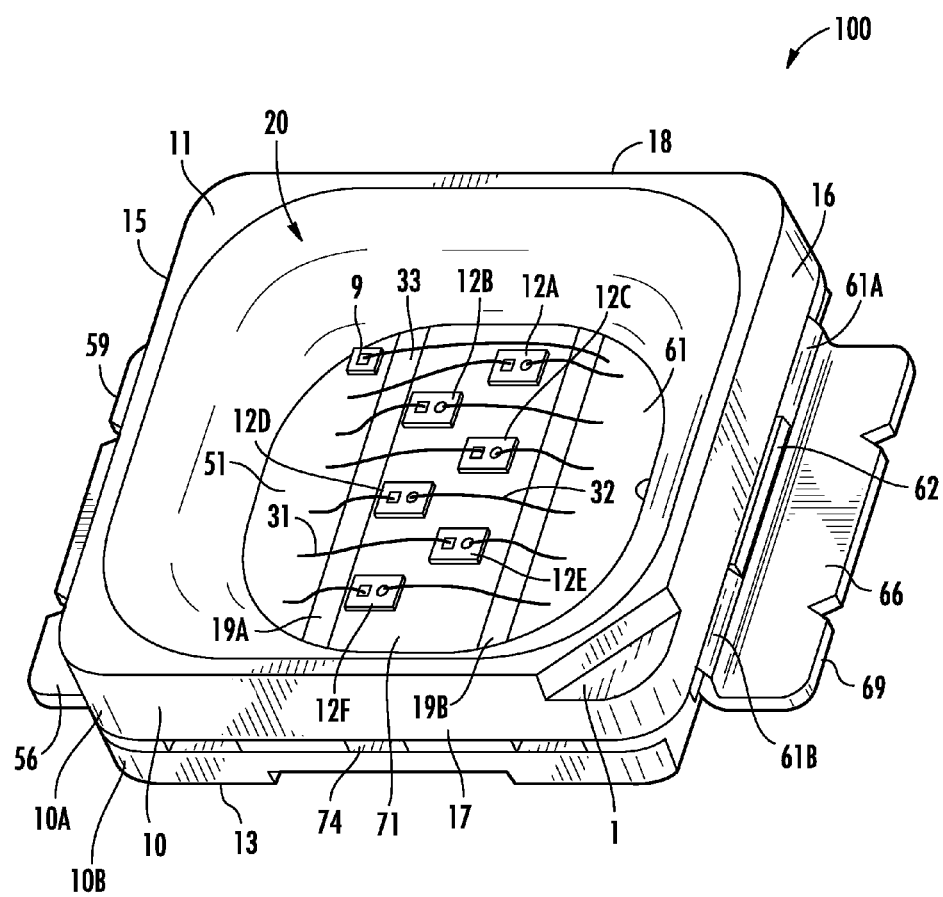
FIG. 1 is a perspective view showing top, side, and end portions of a solid state light emission package according to an embodiment of the present subject matter.

The present subject matter now will be described more fully hereinafter with reference to the accompanying drawings, in which embodiments of the subject matter are shown. The present subject matter may, however, be embodied in many different forms and should not be construed as limited to the specific embodiments set forth herein. Rather, these embodiments are provided to convey the scope of the subject matter to those skilled in the art. In the drawings, the size and relative sizes of layers and regions may be exaggerated for clarity.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, no intervening elements are present. It will also be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

It will be understood that although the terms "first" and "second" are used herein to describe various regions, layers and/or portions, these regions, layers and/or portions should not be limited by these terms. These terms are only used to distinguish one region, layer or portion from another region, layer or portion. Thus, a first region, layer or portion discussed below could be termed a second region, layer or portion, and similarly, a second region, layer or portion may be termed a first region, layer or portion without departing from the teachings of the present subject matter.

Furthermore, relative terms, such as "lower" or "bottom" and "upper" or "top," may be used herein to describe relationship of one or more elements to other elements as illustrated in the Figures. It will be understood that relative terms are intended to encompass different orientations of the device in addition to the orientation depicted in the figures. For example, if a device in the figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The terms "below" or "beneath" can therefore encompass both an orientation of above and below.

Unless otherwise defined, terms (including technical and scientific terms) used herein should be construed to have the same meaning as commonly understood by one of ordinary skill in the art to which this subject matter belongs. It will be further understood that terms used herein should be interpreted as having a meaning that is consistent with their meaning in the context of this specification and the relevant art, and should not be interpreted in an idealized or overly formal sense unless expressly so defined herein.

As used herein, the terms solid state light emitter or solid state light emitting device may include a light emitting diode (LED), laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. The terms solid state emitter and LED are used interchangeably throughout the application.

Solid state light emitting devices according to embodiments of the subject matter may include III-V nitride (e.g., gallium nitride) based LEDs or lasers fabricated on a silicon carbide substrate, such as those devices manufactured and sold by Cree, Inc. of Durham, N.C. Such LEDs and/or lasers may be configured to operate such that light emission occurs through the substrate in a so-called "flip chip" orientation.

Light emitting devices according to embodiments described herein may comprise group III-V nitride (e.g., gallium nitride) based light emitting diodes (LEDs) or lasers fabricated on a growth substrate, for example, silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties.

As used herein, the term "Group III nitride" refers to those semiconducting compounds formed between nitrogen and one or more elements in Group. III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. No. 5,210,051, U.S. Pat. No. 5,393,993, and U.S. Pat. No. 5,523,589, the disclosures of which are hereby incorporated by reference herein in their entireties.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded to a carrier substrate or printed circuit board (PCB), or wire bonded. A vertical device (without or without the growth substrate) may have a first terminal bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

The LED can be coated, at least partially, with one or more phosphors with the phosphors absorbing at least a portion of the LED light and emitting a different wavelength of light such that the LED emits a combination of light from the LED and the phosphor. In one embodiment, the LED emits a white light combination of LED and phosphor light. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. In the alternative, LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED devices and methods according to the present subject matter can also have multiple LEDs of different colors, one or more of which may be white emitting.

Solid state light emitters may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called lumiphoric) materials in LED devices may be accomplished by adding such materials to encapsulants, adding such materials to lenses, or by direct coating onto LEDs. Other materials, such as dispersers and/or index matching materials may be included in such encapsulants.

Referring now to FIGS. 1-6, a solid state light emitter package 100 according to certain embodiments of the present subject matter can comprise a body structure 10 defining a body cavity (preferably reflective to constitute a reflector cavity) 20 containing six solid state emitters 12A-12F. Each emitter 12A-12F is arranged over (i.e., on or adjacent to) the upper surface 71 of a thermal transfer material 70 disposed along the floor of the reflector cavity 20, and each emitter 12A-12F is disposed in electrical communication with a first electrical lead 51 and a second electrical lead 61 using wirebonds 31, 32. In one aspect, each emitter 12A-12F can be electrically connected in parallel as shown. An optional arrangement comprises at least a first emitter of 12A-12F can be electrically connected in series with at least one other of the emitters 12A-12F. In other aspects, emitters 12A-12F can be electrically connected to each other using a combination of series and parallel arrangements. In one embodiment, the emitters 12A-12F may be mounted on an optional submount (not shown) arranged between the emitters 12A-12F and the thermal transfer material 70. In one aspect, the emitters 12A-12F comprise LEDs. The thermal transfer material 70 can be separated from (and preferably electrically isolated from) each of the electrical leads 51, 52 via body portions 19A, 19B, and can be adapted to conduct heat away from the emitters 12A-12F to a lower surface 72 of the thermal transfer material 70 for dissipation therefrom. In one aspect, thermal transfer material 71 comprises a heatsink directing heat away from the one or more LEDs and to an external source such as, for example, a printed circuit board (PCB) or a metal core printed circuit board (MCPCB). An electrostatic discharge protection device 9 (e.g., a zener diode, or alternatively, a ceramic capacitor, transient voltage suppression (TVS) diode, multilayer varistor, and/or Schottky diode) arranged on the first electrical lead 51 and having an associated wirebond 33 is also disposed in electrical communication with the emitters 12A-12F. The electrical leads 51, 61 can extend through exterior side walls 15, 16 disposed at opposing ends of the body structure 10, with lead tab portions 56, 66 extending away from the exterior side walls 15, 16 in a direction outward from a center portion of the package 100, to enable the lead tab portions 56, 66 to be soldered or otherwise connected to a current source and sink (not shown) to permit operation of the emitters 12A-12F.

Figure 6:
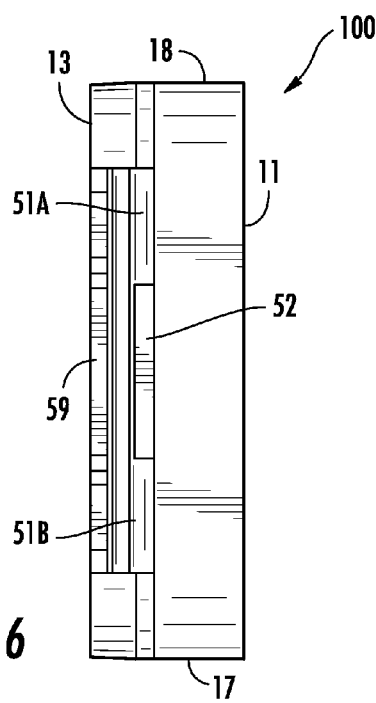
FIG. 6 is an end elevation view of the solid state light emission package of FIGS. 1-5.

The body structure 10 can comprise an upper face 11, lower face 13, and exterior side walls 15-18. The upper face 11 defines a corner notch 1, and the lower face 13 can comprise a recess 2 containing the thermal transfer material 70, with a lower surface 72 and lower protrusion 72A of the thermal transfer material 70 being exposed. In one embodiment, the body structure 10 has a length and a width (e.g., as represented by exterior side walls 15-18) that are substantially equal, such that the body structure 10 has a square-shaped footprint. In another embodiments, the length and width of the body structure 10 may be unequal, with the body structure having a rectangular footprint, or the body structure 10 may be formed in other shapes (e.g., round), including footprints conforming to regular polygonal shapes (e.g., octagonal), or footprints of other shapes not constituting regular polygons. The body structure 10 is preferably formed around a leadframe 50 (defining electrical leads 51, 61) and the thermal transfer material 70 (as illustrated in FIG. 6), with the body structure 10 encasing at least a portion of the leadframe 50 and arranged to retain the thermal transfer material 70. Protruding portions 73, 74 of the thermal transfer material 70 may be exposed along side walls 17, 18 of the body structure 10. The body structure 10 may be advantageously formed using a molding process, such as injection molding, using a thermoplastic and/or thermoset material that is preferably electrically insulating. Polymer-containing materials can be used to form the body structure 10, with such materials optionally being reinforced (e.g., with fibers, ceramics, or composites). The body structure may be white or light in color to minimize dark appearance of the package 100. Ceramic and/or composite materials may be utilized in place of polymers to form the body structure 10 in certain embodiments. As an alternative to injection molding, other types of molding and/or forming processes (e.g., sintering) may be used. The body structure 10 may comprise an upper portion 10A and lower portion 10B (e.g., as may be formed in upper and lower molding die portions (not shown), respectively). The reflector cavity 20 may be formed as the inverse of a central protrusion in an upper molding die.

Figure 3:
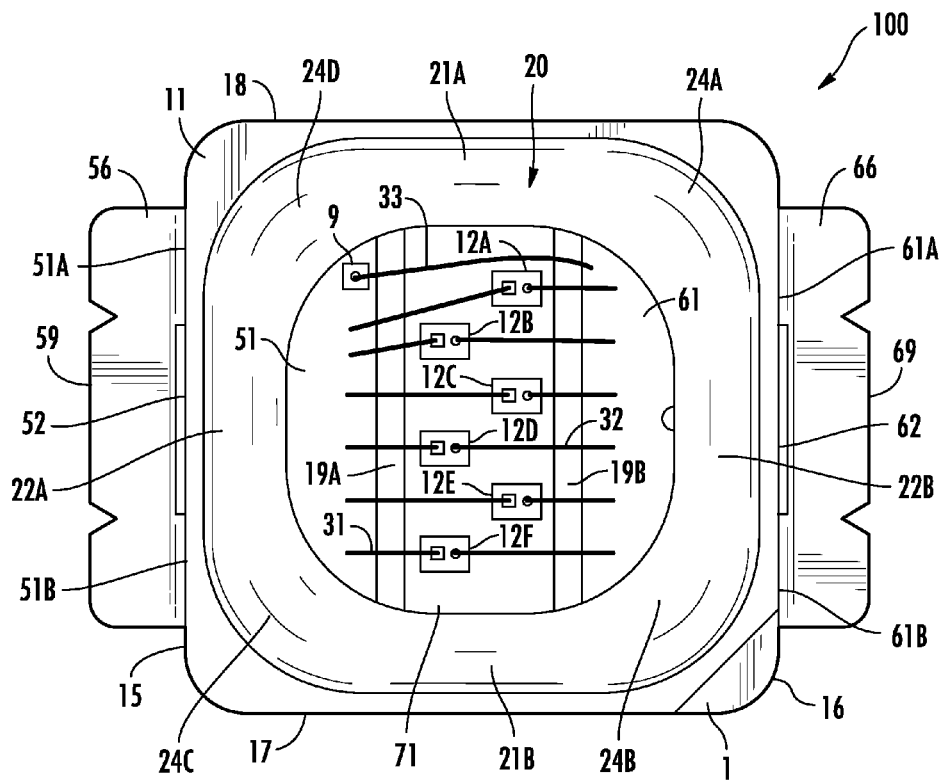
FIG. 3 is a top plan view of the solid state light emission package of FIGS. 1-2.
Figure 7:
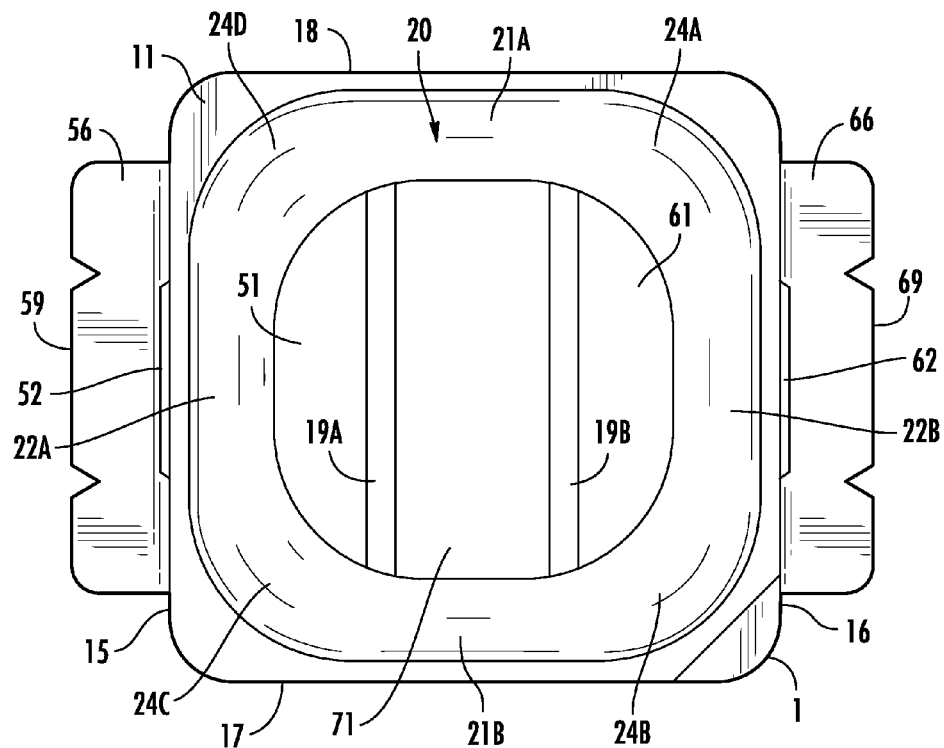
FIG. 7 is a top plan view of a package subassembly prior to complete fabrication of the solid state light emission package of FIGS. 1-6.
Figure 8A:
FIG. 8A is a simplified schematic cross-sectional view of a body portion of the package subassembly of FIG. 7, illustrating the angle of a side wall or end wall portion thereof.
Figure 8B:
FIG. 8B is a simplified schematic cross-sectional view of a body portion of the package subassembly of FIG. 7, illustrating the angle of a transition wall portion thereof.

Referring to FIGS. 3 and 7, the reflector cavity 20 is bounded from below by a floor (including portions of the contacts 51, 61, body portions 19A, 19B, and an upper surface 71 of the thermal transfer material 70), and bounded along edges by side wall portions 21A, 21B, end wall portions 22A, 22B, and transition wall portions 24A-24D. A transition wall portion 24A-24D is disposed between each respective side wall portion 21A, 21B and end wall portion 22A, 22B. Each side wall portion 21A, 21B and each end wall portion 22A, 22B preferably comprises a substantially straight upper edge, and each transition wall portion 24A-24D preferably comprises a curved or segmented upper edge transitioning from the upper edge of a side wall portion 21A, 21B to the upper edge of an end wall portion 22A, 22B. Each transition wall portion 24A-24D is preferably inclined at a larger average angle, relative to a plane perpendicular to the floor of the reflector cavity, than each side wall portion 21A, 21B and each end wall portion 22A, 22B. For example, FIG. 8A provides a simplified schematic cross-sectional view of a body portion, illustrating the angle θ of a side wall portion or end wall portion thereof relative to a plane perpendicular to the floor of the body cavity. Similarly, FIG. 8B provides a simplified schematic cross-sectional view of a body portion, illustrating the angle ϕ of a transition wall portion relative to a plane perpendicular to the floor of the body cavity. In one embodiment, each side wall portion and each end wall portion is inclined at an angle θ of at least about 20 degrees; more preferably at least about 30 degrees; still more preferably at least about 40 degrees. In further embodiments, the angle θ may be at least about 45 degrees, or at least about 50 degrees. In one each transition wall portion is inclined at an angle ϕ of at least about 30 degrees; more preferably at least about 40 degrees; still more preferably at least about 50 degrees. In further embodiments, the angle ϕ may be at least about 55 degrees, or at least about 60 degrees. Such angles of the side wall portions 21A, 21B, end wall portions 22A, 22B, and transition wall portions 24A, 24D are greater than typically employed in solid state emitter devices. Although the side wall/end wall portions and transition wall portions are illustrated in FIGS. 8A-8B as being angular from the floor of the cavity to the upper edge of the package, in an alternative embodiment any one or more (or all) of these wall portions may be characterized by a segmented and/or curved cross-section, that is, with the wall extending from the floor to the upper edge of the package being non-linear along at least a portion thereof. If such walls are curved or segmented, then the inclination angles mentioned above may correspond to an average angle of a curved or segmented wall, or an angle between endpoints of such a wall. Use of side wall portions 21A, 21B/end wall portions 22A, 22B and transition wall portions 24A-24D of alternating angles enables frontal area of the reflector cavity 20 maximized relative to the square-shaped upper surface 11, while providing desirably diffuse output beam characteristics, particularly when multiple emitters are disposed in the cavity 20.

Figure 10:
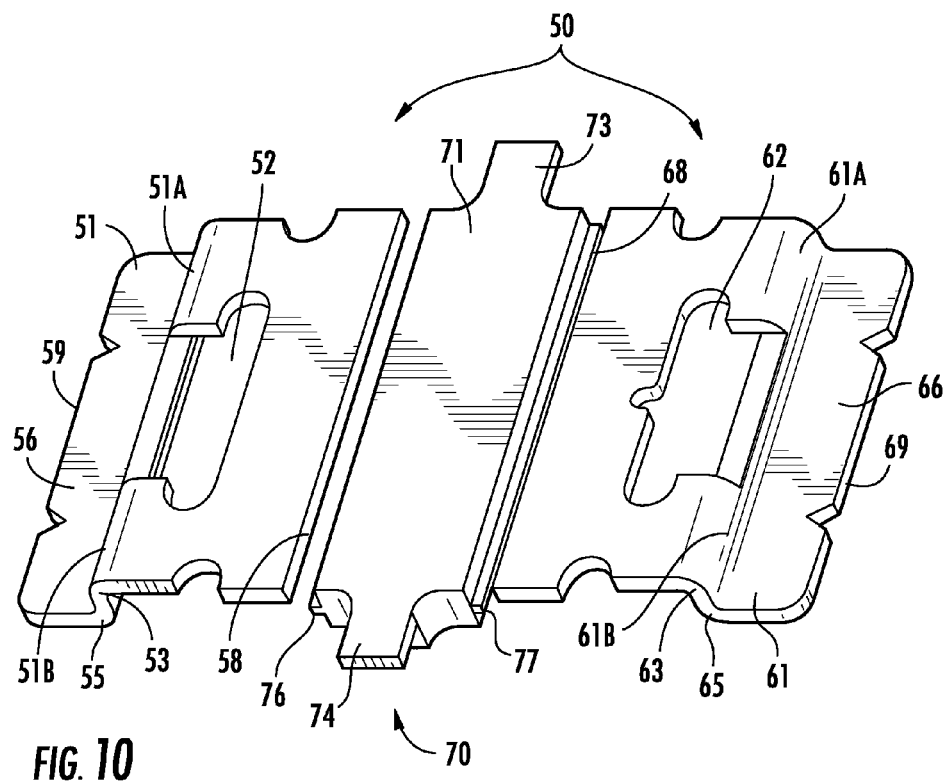
FIG. 10 is a perspective view showing top, side, and end portions of a leadframe and thermal transfer material of the solid state light emission package of FIGS. 1-6 and the package subassembly of FIG. 7-8.
Figure 11:
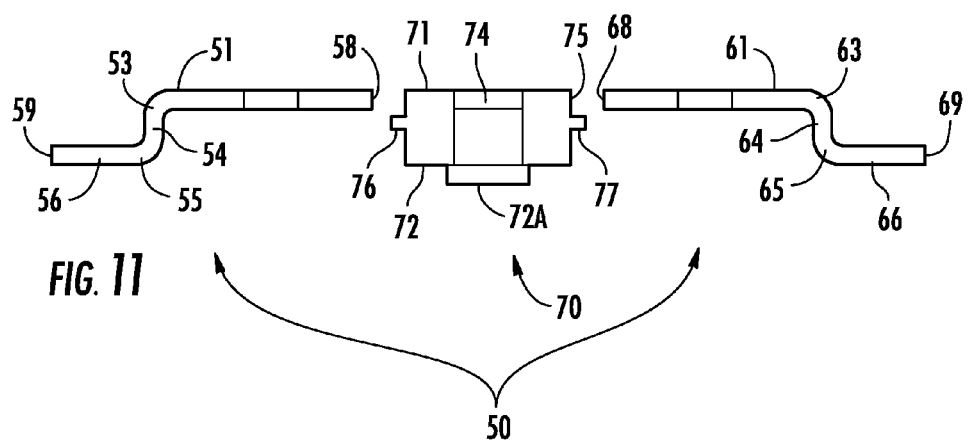
FIG. 11 is a side elevation view of the leadframe and thermal transfer material of FIG. 10.

As indicated previously, the body structure 10 is preferably formed around the leadframe 50 and thermal transfer material 70. Referring to FIGS. 10-11, the leadframe 50 can comprise a first electrical lead 51 and a second electrical lead 61. Each electrical lead 51, 61 can comprise a medial end 58, 68, and a lead tab portion 56, 66 extending away from a center of the emitter package and terminating at a distal end 59, 69. Each electrical lead 51, 61 defines at least one aperture 52, 62 that serves to separate multiple electrical lead segments 51A-51B, 61A-62B. In one embodiment, each electrical lead 51, 61 may comprise multiple apertures serving to separate more than two (e.g., three or more) electrical lead segments. A portion of each aperture 52, 62 is preferably filled with body material of the body structure, with another portion of each aperture 52, 62 being disposed outside the side walls 15, 16 of the body structure 10, such that individual electrical lead segments 51A-51B, 61A-61B are separated from corresponding electrical lead segments 51A-51B, 61A-61B by the apertures 52, 62 along exterior side walls 15, 16 of the body structure 10. Each electrical lead 51, 61 can comprise a first bend 53, 63, a bent portion 54, 64 (that is preferably substantially perpendicular to a plane extending through the medial ends 58, 68), and a second bend 55, 65 transitioning to each electrical lead tab portion 56, 66. Each aperture 52, 62 preferably extends at least into each first bend 53, 63. Each aperture 52, 62 provides multiple benefits. First, a medial portion of each aperture 52, 62 is filled with body material, and thus serves to promote secure retention of the electrical leads 51, 61 within the body structure 10. Second, each aperture 52, 62 serves to reduce the amount of lead material (e.g., metal) subject to being bent to form the first bend 53, 63. This reduces the amount of bending force required to form the first bend 53, 63, as is particularly desirable when the first bend 53, 63 is formed in each electrical lead 51, 61 after formation of the body structure 10 around the electrical leads 51, 61. Bending is preferably performed sufficiently to position at least a portion of each electrical lead 51, 61 in the recesses 5, 6.

Figure 2:
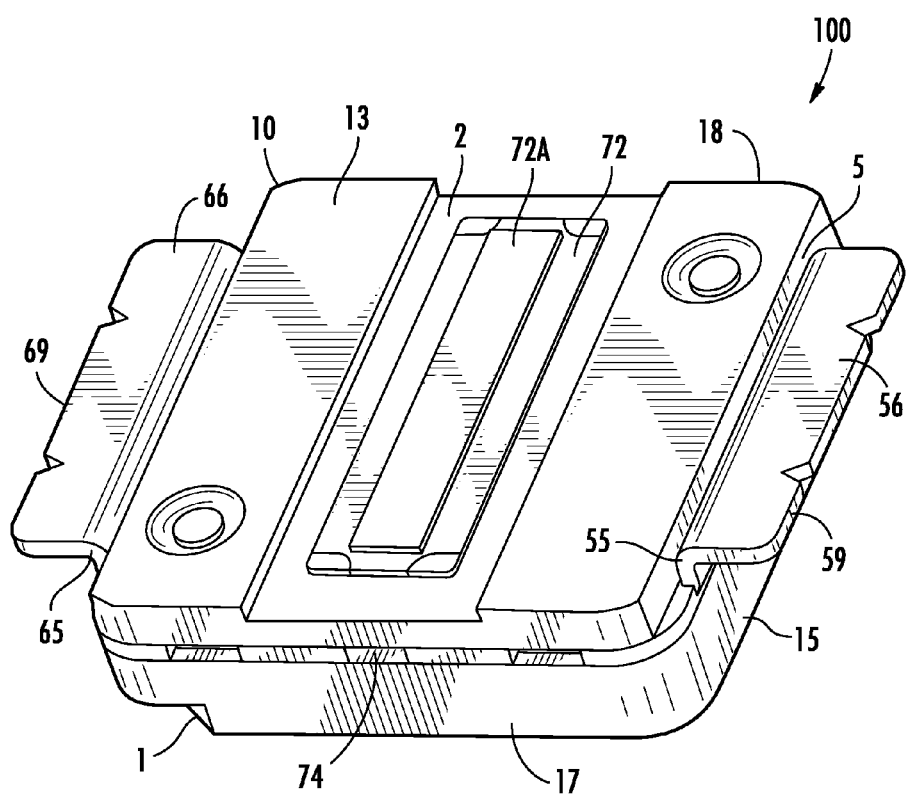
FIG. 2 is a perspective view showing bottom, side, and end portions of the solid state light emission package of FIG. 1.
Figure 4:
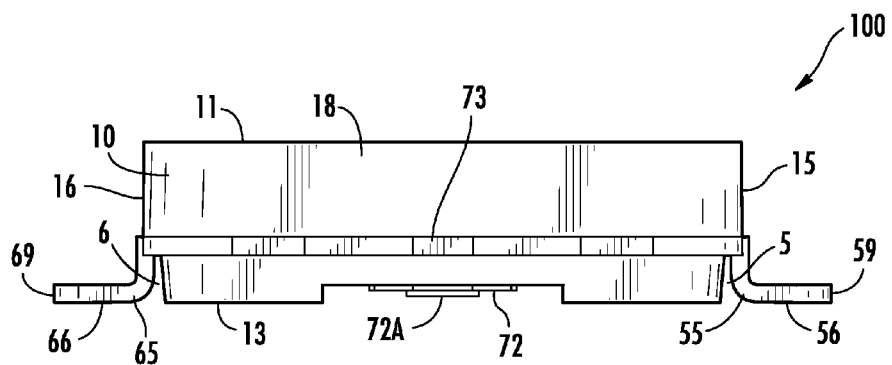
FIG. 4 is a side elevation view of the solid state light emission package of FIGS. 1-3.
Figure 9:
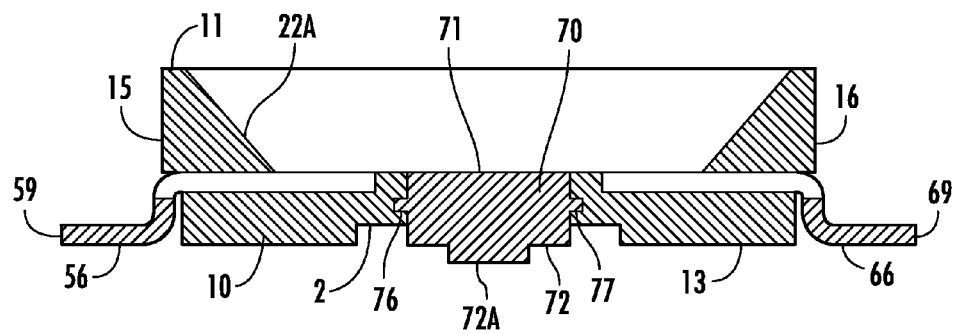
FIG. 9 is a side cross-sectional view of the subassembly of FIG. 7.

Continuing to refer to FIGS. 10-11, the thermal transfer material 70 can comprise an upper surface 71, a lower surface 72 including a downwardly-extending central protrusion 72A. The thermal transfer material 70 defines upper protrusions 73, 74 along ends of the upper surface 71, with such upper protrusions 73, 74 extending through side walls of the body structure 10 (as illustrated in FIGS. 1, 2, and 4) and being exposed along tips thereof. Side walls 75 of the thermal transfer material 70 further define protrusions 76, 77 that promote secure retention of the thermal transfer material 70 by the body structure 20 (as illustrated in FIG. 9), and also reduces potential for leakage (e.g., of flux or solder during manufacture of the emitter package 100, or of encapsulant (not shown) disposed in the cavity 20 during operation of the emitter package 100) along interfaces between the body structure 10 and the thermal transfer material 70. Such protrusions 76, 77 along side walls 75 of the thermal transfer material 70 may be varied in number, size, shape, and orientation (e.g. angled upward or downward).

The leadframe 50 may be stamped from a first flat sheet of metal or other conductive material. The thermal transfer material 70 may be stamped from a second flat sheet of metal or other conductive material, with the second sheet preferably being thicker than the first sheet to enable the resulting thermal transfer material 70 to have a substantially greater average thickness than the electrical leads 51, 61. Relative to an average thickness of the electrical leads 51, 61, an average thickness of the thermal transfer material 70 is preferably at least two times as thick, and more preferably at least about 2.5 times as thick. A multitude of leadframes may be defined in a single first sheet, and a multitude of thermal transfer materials may be defined in a second sheet, and body structure material may be formed around such first and second sheets to simultaneously form a multitude of emitter package subassemblies (e.g., such as the individual subassembly shown in FIGS. 8-9). Bends 53, 54, 63, 64 may be defined in electrical leads 51, 61 of each package subassembly after formation of the body structure. The multitude of emitter package subassemblies may be separated into individual package subassemblies by cutting adjacent to side walls 17, 18 and distal ends 59, 69 of the lead tab portions 56, 66. Such cutting exposes tips of the thermal transfer material protrusions 73, 74 along side walls 17, 18 of each emitter package 100.

Figure 5:
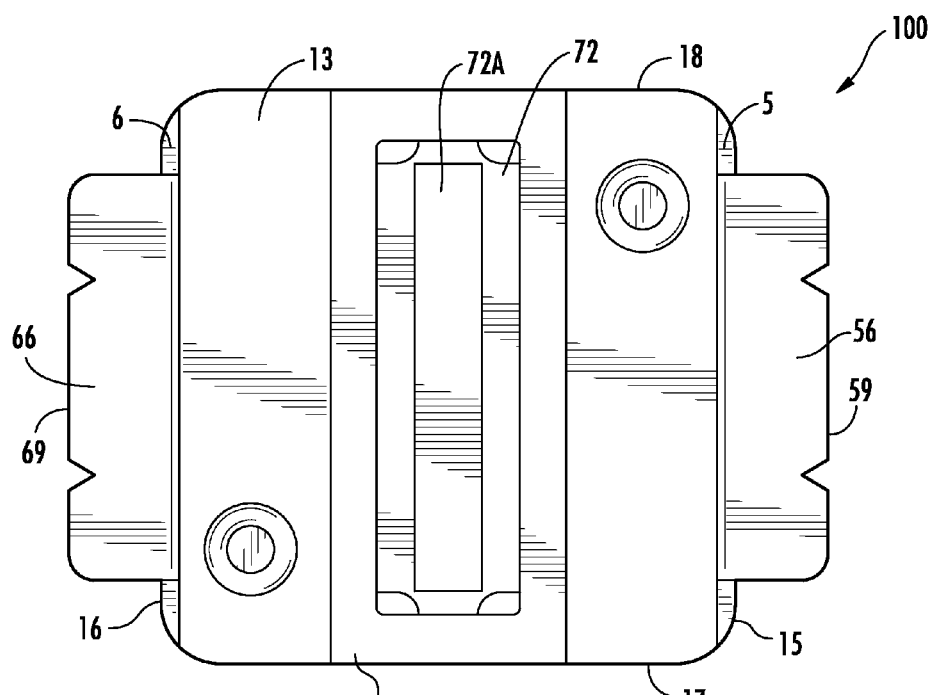
FIG. 5 is a bottom plan view of the solid state light emission package of FIGS. 1-4.

Referring to FIGS. 2, 4, and 5, recesses 5, 6 are preferably defined in exterior side walls 15, 16 of the body structure 10 adjacent to (e.g., below) locations where the leads 51, 61 extend through the exterior side walls 15, 16. Such recesses 5, 6 are preferably arranged to receive the bent portion (or at least part of the thickness of the bent portion) of each electrical lead 51, 61. Each recess 5, 6 has a depth relative to the corresponding exterior side wall 15, 16, with the depth of each recess 5, 6 preferably being at least as large as an average thickness of the electrical leads 51, 61. The recesses 5, 6 provide multiple benefits. First, the recesses 5, 6 eliminate presence of material immediately disposed below the first bends 53, 63, thereby reducing stress applied to the body structure 10 when the first bends 53, 63 are formed after the leadframe 50 (including electrical leads 51, 61) is retained in the body structure 10. Second, the recesses 5, 6 enable each first bend 53, 63 to have a tighter bending radius and reduce or eliminate outward extension of the bent portions 54, 64 (preferably substantially perpendicular to the lower body surface 13 and the electrical lead tab portions 56, 66) relative to the side walls 15, 16, thereby reducing the effective footprint of the light emission package 100. Reduction of effective footprint of emitter packages 100 enables such packages 100 to be mounted at higher density on an underlying substrate (not shown), and optionally overlaid with a Lambertian reflector or diffuser having reduced hole spacing (e.g., within a backlit display device, such as a liquid crystal display (LCD)), thereby enhancing lighting performance such as by enabling higher flux density and/or greater lighting uniformity.

Figure 12A:
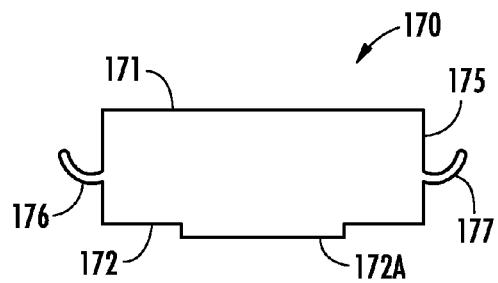
FIG. 12A is a cross-sectional schematic view of a thermal transfer material according to one embodiment and useable with a solid state light emission package as disclosed herein.
Figure 12B:
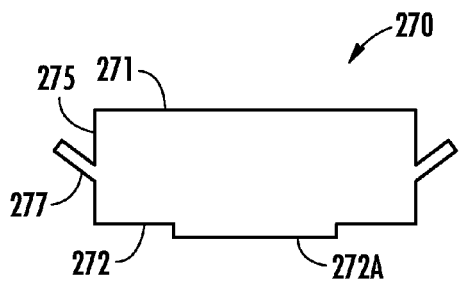
FIG. 12B is a cross-sectional schematic view of a thermal transfer material according to another embodiment and useable with a solid state light emission package as disclosed herein.
Figure 12C:
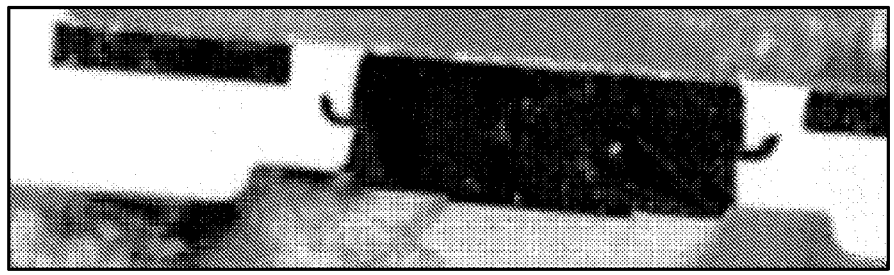
FIG. 12C is a cross-sectional view of a portion of a solid state light emission package according to one embodiment of the present subject matter, showing a thermal transfer material similar to the embodiment illustrated in FIG. 12A.

Referring to FIG. 12A, in one embodiment a thermal transfer material 170 for integration and use with a solid state emitter package (e.g., package 100) may comprise an upper surface 171, a lower surface 172, a lower protruding portion 172A, and curved lateral protrusions 176, 177 extending outward from side walls 175. A photograph showing a cross-section of a thermal transfer material with similarly curved lateral protrusions is shown in FIG. 12C. Referring to FIG. 12B, in another embodiment a thermal transfer material 270 may comprise an upper surface 271, a lower surface 272, a lower protruding portion 272A, and upwardly-angled lateral protrusions 276, 277 extending outward and upward from side walls 275. Downwardly-angled lateral protrusions may be employed in a similar embodiment (not shown). Any combinations of the foregoing lateral protrusions may be employed. Lateral protrusions may be formed by any suitable manufacturing method, including stamping, extrusion, milling, and the like. In further embodiments, the lateral protrusions may be replaced with, or supplemented by, recesses (not shown) in side walls of a thermal transfer material to provide similar sealing utility, with such recesses being formable by similar methods.

Figure 13:
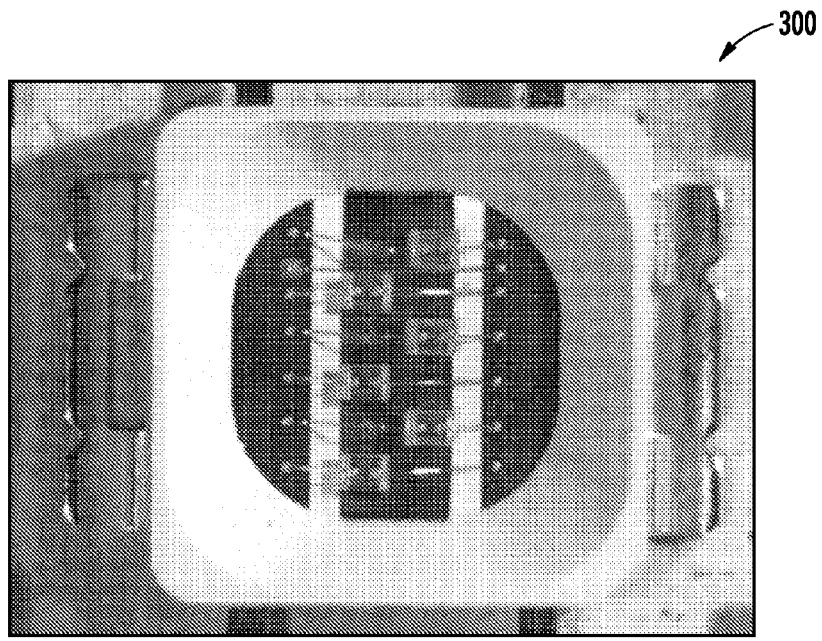
FIG. 13 is a top plan view of a solid state light emission package according to another embodiment of the present subject matter, the package lacking encapsulant in the reflector cavity for clarity of illustration.

FIG. 13 shows a top plan view photograph of a solid state emitter package 300 similar to the package 100 described hereinabove. To promote ease of viewing, such package 300 is devoid of encapsulant, diffuser, and/or lens material (as otherwise may be retained in the cavity to cover and/or protect the emitters and wirebonds, and to optionally interact with light emitted by the emitters), but it is to be understood that emitter packages as disclosed herein may desirably comprise encapsulant, diffuser and/or lens material, optionally including at least one lumiphor to interact with light emitted by the emitters and responsively emit light of a different wavelength. The package 300 according to the present embodiment differs from the package 100 according to a prior embodiment with respect to layout of the wirebonds (e.g., the wirebond of the electrostatic discharge device may extend to a second contact, rather than contacting a wirebond for an emitter), and with respect to size of the apertures defined in the electrical leads. As compared to the apertures 52, 62 defined in the electrical leads 51, 61, the apertures shown in FIG. 13 are larger.

Figure 14A:
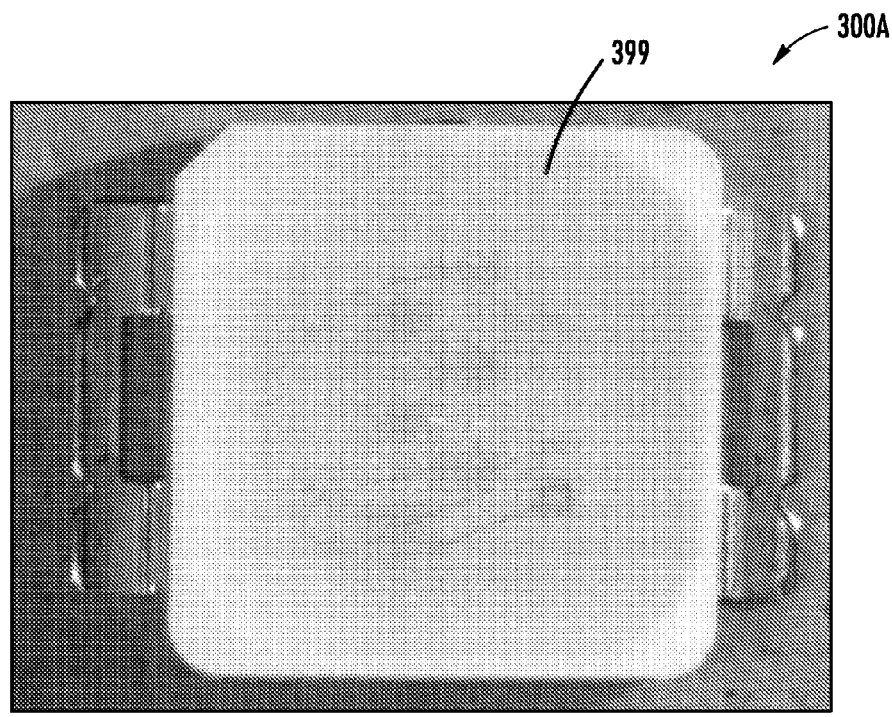
FIG. 14A is a top plan view of a solid state light emission package similar to the package of FIG. 13, but including encapsulant in the reflector cavity.
Figure 14B:
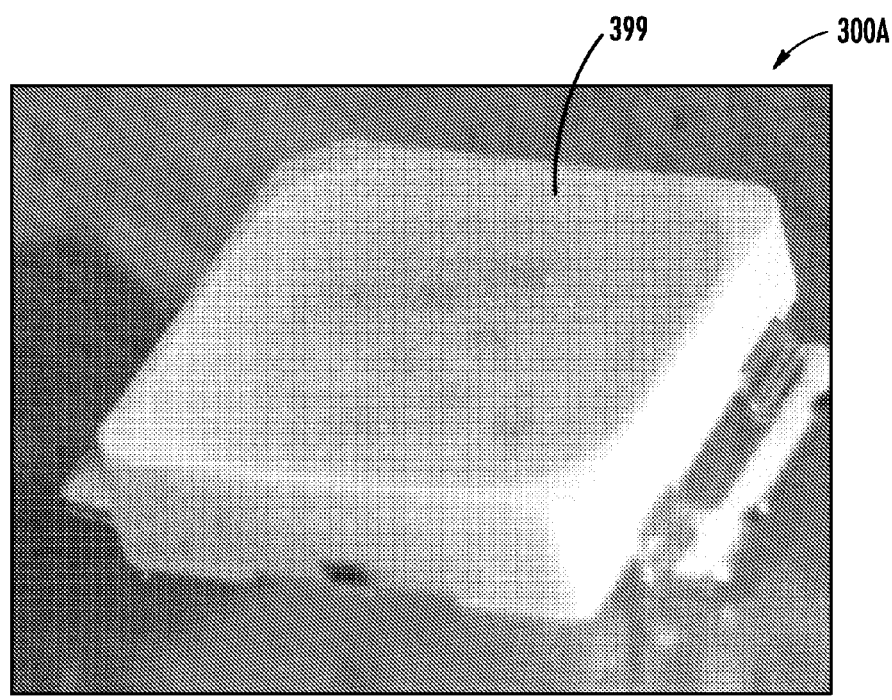
FIG. 14B is a perspective view showing top, side, and end portions of the solid state light emission package of FIG. 14A.

FIGS. 14A-14B depict a solid state light emission package 300A similar to the package 300 depicted in FIG. 13, but the package 300A can comprise encapsulant material 399 disposed within the cavity containing the emitters, and the wirebond arrangement in the package 300 differs from wirebond arrangements shown in prior embodiments.

As discussed previously, body structure 10 can comprise a white plastic material, more specifically, a molded white plastic material. In one aspect, body structure 10 can comprise any suitable moldable material. In another aspect, body structure 10 can comprise a plastic material having quantitative and qualitative properties optimized for solid state device package applications. The plastic material can in one aspect comprise, for example, any suitable organic polymer, such as for example a heat resistant resin such as a polyamide resin. The plastic material can be filled with glass or mineral material for strength and something like titanium dioxide for reflectivity.

Utilizing a plastic material such as described herein for body structure 10 of, for example, package 100 allows for an advantageous softness for body structure 10 at operating temperatures as hardness can depend upon temperature. This softness allows body structure 10 to desirably have improved reliability and useful lifetime. The plastic material can in one aspect be a liquid crystal polymer (LCP). An optimized plastic material in accordance herewith can comprise a glass transition temperature ($T_g$) that can, for example, be greater than approximately 110 degrees Celsius (° C.). The glass transition temperature ($T_g$) can, for example, be greater than approximately 115° C. or greater than approximately 120° C. In one aspect, the glass transition temperature ($T_g$) can be greater than approximately 123° C. The optimized plastic material in accordance herewith can also comprise a melting point temperature ($T_m$) that can be less than approximately 315° C. The melting point temperature ($T_m$) can, for example, be less than approximately 310° C. The melting point temperature ($T_m$) can, for example, be less than approximately 300° C. In one aspect, the melting point temperature ($T_m$) can be approximately 307° C. A plastic material with a $T_g$ of approximately 123° C. is higher than many plastics conventionally used and can allow the package to have increased stability at elevated temperatures. A plastic material with a lower $T_m$ of approximately 307° C. can allow better flowability because the melting temperature is lower than that of plastics conventionally used and the plastic body is easier to mold. The plastic selected for body structure 10 can also comprise optimized qualitative properties. For example, a white plastic material can be chosen which exhibits a better reflectivity retention value while also exhibiting fewer tendencies to discolor, degrade, and/or yellow when subjected to heat and/or light exposure. The reflectivity of the plastic material can in one aspect be greater than 90% for example, and that level or another level of high reflectivity can be maintained over time, heat, moisture, and blue light exposure.

Other characteristics or features of the plastic material for body structure 10 can comprise an elongation value (mechanical property) of approximately 1.4% or greater, or an elongation value of 1.6% or greater. In one aspect, the elongation value can be approximately 1.5% or greater. Also as a mechanical property, the flexural strength of the plastic material of body structure 10 as measured by ASTM D790 standards can be approximately 150 MPa or lower, approximately 130 MPa or lower, or approximately 120 MPa or lower. In one aspect, the flexural strength of the plastic material of body structure 10 can be approximately 140 MPa or lower as measured by ASTM D790 standards. Also as a mechanical property, the flexural modulus of the plastic material of body structure 10 can be approximately 6.9 GPa or lower, or approximately 6.5 GPa or lower. In one aspect, the flexural modulus of the plastic material of body structure 10 can be approximately 6.0 GPa or lower. As yet another mechanical property, the tensile strength of the plastic material of body structure 10 can be approximately 100 MPa or lower as measured by ASTM D638 standards, approximately 90 MPa or lower, or approximately 80 MPa or lower. In one aspect, the tensile strength of the plastic material of body structure 10 can be less than approximately 75 MPa as measured by ASTM D638 standards.

Figure 15A:
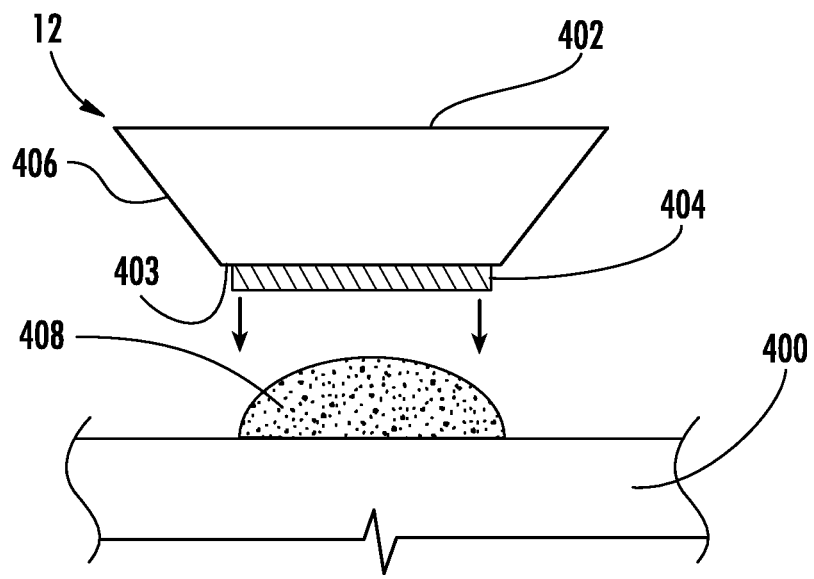
FIGS. 15A and 15B illustrate a side view of a solid state emitting device and a light emission package according to the present subject matter.
Figure 15B:
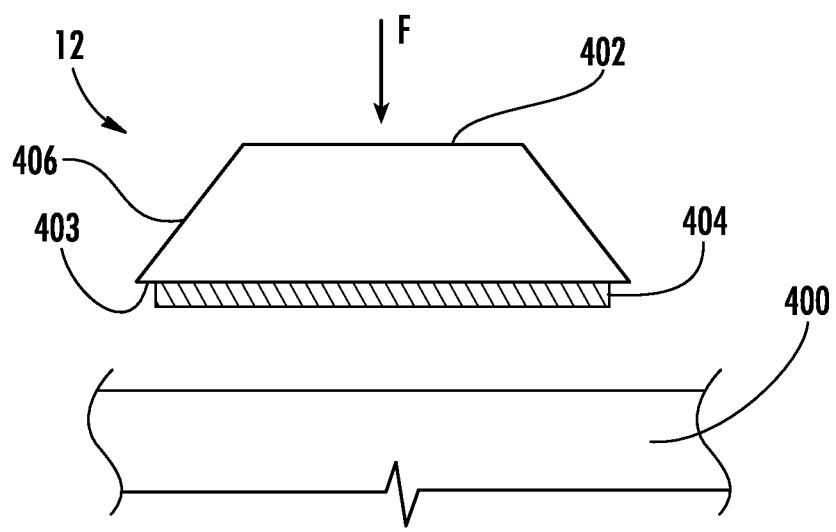

FIGS. 15A and 15B illustrate side views of a solid state emitter generally designated 12 as it may be positioned for mounting over substrate 400. Substrate 400 can comprise any suitable metallic material and can comprise any substrate within an emitter package, such as package 100 (FIG. 1). For example, substrate 400 can comprise thermal transfer material 70 or any layer otherwise deposited over thermal transfer material 70. Solid state emitter 12 can comprise any size, shape, dimension, and/or structure of, for example, a LED chip. FIG. 15A illustrates an example of a metal-to-metal die attach. FIG. 15B illustrates another example of a metal-to-metal die attach. Metal-to-metal die attach refers to attaching or bonding of one or more metals of the emitter to substrate 400 disposed within an emitter package. For example, the metals which can attach during metal-to-metal die attach techniques can comprise at least two of (i) a layer of metal on the backside of solid state emitter 12, (ii) metallic substrate 400 within emitter package 100 over which the emitter will become mounted, and/or (iii) a metal assist material disposed between the emitter 12 and substrate 400. Substrate 400 can comprise any suitable metal such as, but not limited to, silver (Ag) or platinum (Pt).

FIGS. 15A and 15B illustrate solid state emitter 12 comprising an upper surface 402 and a bonding surface 403. Solid state emitter 12 can comprise a horizontally structured device or a vertically structured device as previously described. Upper surface 402 of solid state emitter 12 can comprise one or more bondpads disposed thereon for wirebonding to electrical elements, for example, first and second electrical leads (FIG. 1). In one aspect, solid state emitter 12 can comprise a vertically structured device wherein upper surface 402 can comprise a single bondpad. In another aspect, solid state emitter 12 can comprise a horizontally structured device wherein upper surface 402 can comprise two bondpads. In a further aspect, solid state emitter 12 can comprise a horizontally structured device wherein each of the p and n-sides electrically communicate with substrate 400 such that upper surface 402 does not require bondpads. Bonding surface 403 of solid state emitter 12 can comprise a portion of the p-side, n-side, or each of the p and n-sides of an LED device. In one aspect, the emitter can be connected to substrate 400 at an insulating side of the LED device. In one aspect, the emitter can be connected to a substrate 400 at a portion of the growth substrate or carrier substrate of the LED such as previously discussed.

FIGS. 15A and 15B illustrate the bonding surface 403 of solid state emitter 12 as comprising a backside metal pad or bonding layer 404 for mounting over substrate 400. Bonding layer 404 can extend the full length and/or surface area of bonding surface 403 or any suitable portion thereof. Solid state emitter 12 can comprise lateral sides 406 which can extend between upper surface 402 and bonding surface 403. FIGS. 15A and 15B illustrate inclined lateral sides 406, however, lateral sides 406 can be substantially vertical or straight where a straight-cut emitter is selected. FIG. 15A illustrates upper surface 402 having a greater surface area than the surface area of bonding surface 403. FIG. 15B illustrates upper surface 402 having a smaller surface area than the surface area of bonding surface 403. In some aspects, bonding surface 403 and upper surface 402 comprise the same surface area. As noted earlier, solid state emitters 12 can comprise a square, rectangle, or any suitable shape in addition to having any suitable lateral side configuration.

Any suitable die attach method can be used to mount solid state emitter 12 within a LED package, for example, over substrate 400. In one aspect, any suitable optimized die attach method and/or materials can be used. For example, optimized die attach methods can comprise metal-to-metal die attach methods for facilitating attachment of one or more metals on and/or between the solid state emitter 12 and substrate 400. FIG. 15A illustrates an example of a metal-to-metal die attach method which can be eutectic or non-eutectic. This metal-to-metal die attach method can comprise using an attach material 408 to facilitate the metal-to-metal die attach. In one aspect, a flux-assisted eutectic metal-to-metal die attach method can be used and in other aspects a metal-assisted non-eutectic metal-to-metal die attach method can be used. In a flux-assisted eutectic, or flux eutectic, die attach method, bonding layer 404 can comprise a metal alloy having a eutectic temperature, for example, but not limited to, an alloy of gold (Au) and tin (Sn). For example, bonding layer 404 can comprise an 80/20 Au/Sn alloy having a eutectic temperature of approximately 280° C. In the flux eutectic technique, attach material 408 can comprise a flux material. In the non-eutectic technique, attachment material 408 can comprise a metallic material. The flux material can serve as a conduit for facilitating the metal-to-metal die attach between the bonding layer 404 and substrate 400 when the bonding layer 404 is heated above the eutectic temperature. The metal of bonding layer 404 can flow into and attach to the metal of substrate 400. The metal of bonding layer 404 or can atomically diffuse and bond with atoms of the underlying mounting substrate 400. In one aspect, flux used in a flux-assisted eutectic method can comprise a composition, for example, 55-65% rosin and 25-35% polyglycol ether in addition to small amounts of other components. Any suitable flux material can be used however.

One consideration when choosing a material for use in flux-assisted eutectic die attach can be the melting point $T_m$ of the solid state chip bonding layer 404. A flux chosen for use can be liquid at room temperature or can require heating or melting to reach a melting point $T_m$. In one aspect, the body structure of a package in which an emitter will be attached can comprise a plastic material having a melting point within approximately 28° C. or less of the eutectic temperature of the bonding layer. In one aspect, at least one LED can be mounted over the substrate 400 at a mounting temperature of approximately 280° C. or greater. Body structure 10 can comprise a plastic material with a melting point of approximately 28° C. or less from the mounting temperature at which the at least one LED is mounted or attached. The melting point can be approximately 25° C. or less from the mounting temperature at which the at least one LED is mounted or attached, approximately 20° C. or less from the mounting temperature at which the at least one LED is mounted or attached, or even approximately 10° C. or less from the mounting temperature at which the at least one LED is mounted or attached. Using flux-assisted eutectic die attach in such a package is unexpected based upon this small temperature difference and the possibility that the plastic may begin to be adversely affected during the die attach process.

Flux-assisted eutectic die attach methods can be tedious, and it is unexpected to use such methods when attaching solid state emitters within a molded plastic package body or for backlighting applications or situations. The flux eutectic die attach according to the present subject matter can utilize dispensing flux assist material 408, that can be liquid at room temperature, in an amount to be precisely the right volume to avoid either swimming of the emitter chips or poor die attach if too much or too little flux is used. Flux-assisted eutectic die attach according to the present subject matter can also require the right composition for each of the flux assist material 408 and bonding metal 404 of the emitter chips. Flux-assisted eutectic die attach according to the present subject matter can optimally utilize a very clean and flat surface and substrates that do not move or bend during heating and cooling such to stress the solder joint. Flux-assisted eutectic according to the present subject matter can utilize a fine surface roughness that is small enough not to encumber the Au/Sn bonding surface of the emitter chips while being rough enough to allow flux to escape during heating. The heating profile can be matched perfectly to the bonding metal 404, such as Au or AuSn, to ensure a good weld between the bonding metal 404 and underlying substrate 400. Using flux-assisted eutectic for die attach according to the present subject matter also can utilize an inert atmosphere, such as a nitrogen atmosphere, to reduce oxygen gas ($O_2$) levels and also allow gravity to apply a downward force on the emitter 12. This can reduce the amount of oxidation at the metal-to-metal bond between bonding layer 404 and underlying substrate 400.

Flux-assisted eutectic die attach can comprise several process techniques, for example, using a heated collet for dispensing the flux material 408, heating the substrate and/or entire LED package, forming a gas, and applying pressure to the LED to the underlying mounting substrate. Methods can also comprise using a heated collet in combination with heating the mounting substrate and/or entire LED package and applying pressure. Body structure 10 can be heated quickly using microwave, laser, conduction and/or excitation fields, etc. all which can be done quickly and in an inert atmosphere allowing the body structure 10 to attain at least the eutectic temperature of the Au/Sn bonding metal on the LED solid state emitter (at least approximately 280° C.). Heating thereby facilitates adequate metal-to-metal bonding between the bonding layer 404 of emitter chips and underlying mounting substrate 400. In one aspect, sonic scrubbing or thermosonic scrubbing techniques can also be used, as the friction of the scrubbing step can generate the heat required for metal-to-metal bonding. Flux-assisted eutectic die attach methods can also comprise plasma cleaning in an inert atmosphere before and/or after flux eutectic die attach.

Still referring to FIG. 15A, a non-eutectic metal-to-metal die attach method can be used which can also comprise an assist material 408, the assist material 408 can comprise a metallic material. In this aspect, bonding layer 404 can comprise a single metal or a metal alloy. For example, bonding layer 404 can comprise Au, Sn, or AuSn. In non-eutectic methods, the bonding layer does not need to reach or exceed a temperature, for example, a eutectic temperature. In this aspect, assist material 408 can comprise a metallic material to facilitate the metal-to-metal bonding. For example, assist material 408 can comprise AuSn paste or Ag epoxy. Any suitable metallic assist material 408 can be used. The metal of bonding layer 404 can attach to the metal of the assist material 408. The metal of the assist material 408 can also attach to the metal of substrate 400. In one aspect, a metal "sandwich" forms between bonding layer 404, assist material 408, and substrate 400 in non-eutectic metal-to-metal attach techniques where a metallic assist material 408 is used. Metal-assisted, non-eutectic die attach can be tedious, just as flux-assisted methods, and it is also unexpected to use such methods when attaching solid state emitters within a molded plastic package body or for backlighting applications or situations. Metal-to-metal attachment using an assist material 408 can be hard to control and tedious when attaching multiple emitters within a package having a plastic body. Heating the package to the appropriate temperature such that assist material 408 can facilitate metal-to-metal die attach can be hard to achieve in plastic packages, for example, packages comprising optimized plastic.

FIG. 15B illustrates a metal-to-metal die attach technique which does not require an assist material 408. One such method can comprise a thermal compression die attach method wherein the metal of bonding layer 404 will directly attach to the metal of substrate 400. The thermal compression method can be eutectic or non-eutectic. In one aspect, thermal compression can be used when bonding layer 404 comprises an alloy having a eutectic temperature. In other aspects, bonding layer 404 can comprise a metal not having a eutectic temperature. Substrate 400 can comprise any suitable metal, not limited to Ag or Pt. In one aspect, bonding layer 404 comprises any suitable metal. In one aspect, bonding layer 404 can comprise a layer of Sn having any suitable thickness. In one aspect, bonding layer 404 can comprise a thickness greater than approximately 0 µm. In one aspect, bonding layer 404 can comprise a bonding layer equal to or greater than at least approximately 0.5 µm. In one aspect, bonding layer 404 can comprise a layer of Sn having a thickness of at least equal to or greater than approximately 2.0 µm. Unlike the flux-assisted eutectic or metal-assisted non-eutectic methods just described, thermal compression metal-to-metal die attach techniques can utilize an external downward force F as illustrated in FIG. 15B. Force F can comprise a compression delivered in a heated environment, thus deemed a thermal compression, as opposed to dispensing a flux or metallic assist material 408. The thermal compression technique is an alternative die attach method developed to reduce metal squeeze out of the bonding layer 408 which can form Shottky or Shunt defects and allow subsequent leakage of current and other various and related problems. In one aspect, the bonding temperature in thermal compression techniques can be approximately 255-265° C. after subjecting substrate 400 to a pre-heat treatment or process. The substrate can be heated to a mounting temperature of at least 20° C. above the melting temperature of the bonding layer 404. The bonding time can be approximately 300 msec and the bonding force can be approximately 50+/−10 grams (g). Predetermined settings can be important for this method, including adequate preheat, bonding temperature, bonding time, and bonding force. The equipment and predetermined settings for use with thermal compression methods can be difficult to use and/or maintain, and it is unexpected to use such methods when attaching solid state emitters within a molded plastic package body or for backlighting applications or situations.

Although metal-to-metal methods have previously been used in solid state device packages comprising ceramic substrates and package bodies (in non-backlighting situations), it is not known and is unexpected to use flux-assisted eutectic, metal-assisted non-eutectic, or thermal compression die attach techniques for device packages having molded plastic bodies. It is also not known and is unexpected to use flux-assisted eutectic, metal-assisted non-eutectic, and/or thermal compression attach techniques in LED backlighting situations as described further herein. It is also quite unexpected to use flux-assisted, metal-assisted, or thermal compression die attach techniques with molded plastic body structure 10 having optimized plastic material that can have, for example, a $T_m$ of approximately 307° C. Light packages having emitters utilizing metal-to-metal die attach methods as described herein can, for example and without limitation, offer light output of up to 122 lumens at 300 mA in cool white (CW), and up to 100 lumens at 300 mA in warm white (WW) color points. For example, LED packages disclosed herein can be used in lighting fixtures offering a minimum CRI for CW color points of 65 CRI. LED packages disclosed herein can be used in lighting fixtures offering a minimum CRI for CW color points of 75 CRI which corresponds to a range of 5,000 K to 8,300 K CCT. LED packages disclosed herein can also offer, for example, a minimum CRI for WW color points of 80 CRI which corresponds to a range of 2,600K to 3,700K CCT. Such LED packages can be used for both standard and high voltage configurations.

Figure 16A:
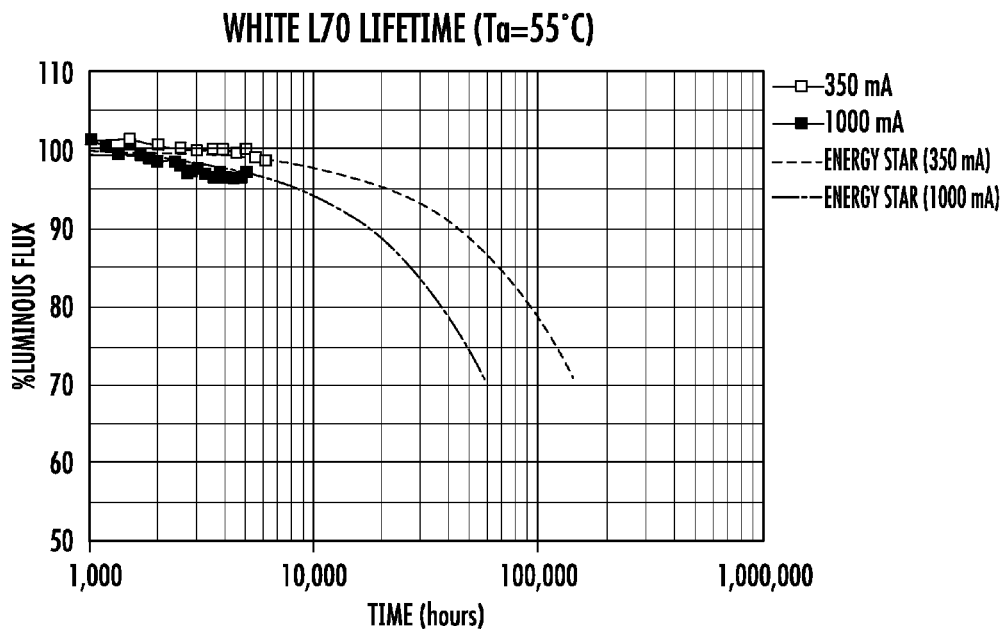
FIGS. 16A and 16B graphically illustrate measured and extrapolated long-term L70 lifetime values at two different ambient temperatures ($T_a$)
Figure 16B:
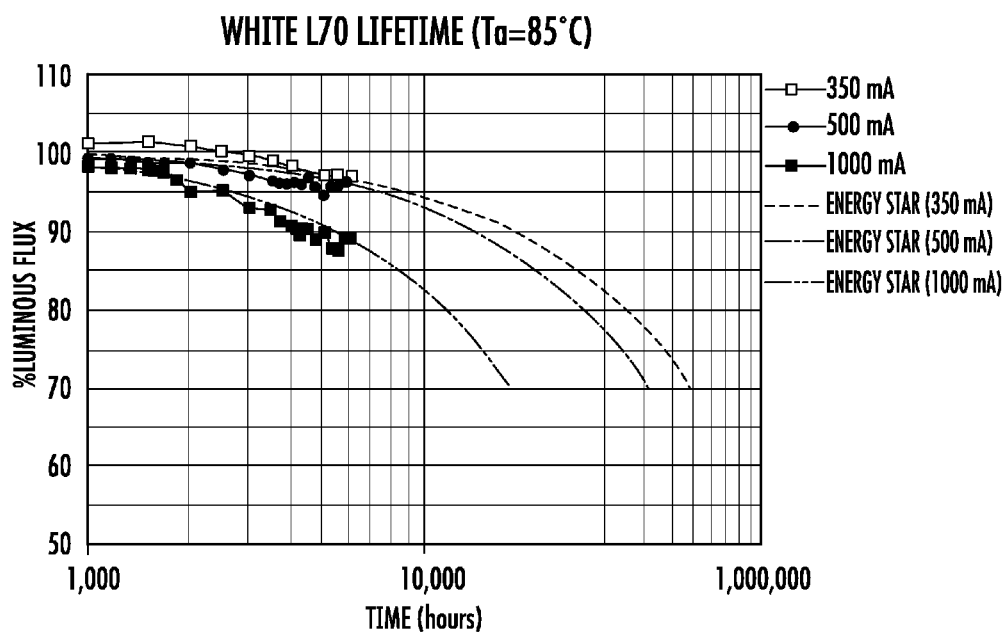

FIGS. 16A and 16B illustrate predicted long term white L70 lifetime values which can be expected using solid state device packages comprising, for example, optimized plastic and/or metal-to-metal die attach methods and materials in accordance herewith. The metal-to-metal die attach method can comprise one of the flux-assisted eutectic, metal-assisted non-eutectic, or thermal compression methods described in FIGS. 15A and 15B. Lumen Maintenance life ($L_{XX}$) values represent the elapsed operating time over which the solid state lighting devices will maintain the percentage, XX %, of its initial light output. For example, L70 equals the time to 70% lumen maintenance in hours, that is, L70 equals the time to maintain 70% of its initial light output in hours. FIG. 16A illustrates the predicted mean white L70 lifetime measured and extrapolated at an ambient air temperature ($T_a$) of 55° C. FIG. 16B illustrates the predicted mean white L70 lifetime measured and extrapolated at $T_a$ of 85° C. The values represented by the white squares were measured at a current of 350 mA for 6,000 hours and then extrapolated to 70% using the ENERGY STAR exponential method fit to the last data point. The values represented by the black squares were measured at a current of 1000 mA for 6,000 and extrapolated to 70% using the same ENERGY STAR method fit to the last data point. In FIG. 16B, values represented by the black circle were measured at a current of 500 mA for 6,000 hours and then extrapolated to 70% using the ENERGY STAR method fit to the last data point. According to the measured data and extrapolations above, the L70 lifetime for the packages described herein can be approximately 150,000 hours or greater at 350 mA at 55° C. Table 1.0 below comprises interpolated values of data for 55° C. as illustrated in FIG. 16A, and the interpolated values are designated by an asterisk (*).

TABLE 1.0

| Current (mA) | Ta (° C.) | L70 (hours) |
|---|---|---|
| 350 | 55 | 150,696 |
| 400 | 55 | 140,508* |
| 500 | 55 | 122,151* |
| 600 | 55 | 106,193* |
| 700 | 55 | 92,320* |
| 800 | 55 | 80,259* |
| 900 | 55 | 69,774* |
| 1000 | 55 | 60,659 |

The light emission package according to the present subject matter can therefore be operable to emit light with an output of approximately 70% or greater of an initial light output for at least approximately 150,000 hours or more. That is, under normal operating conditions, the packages disclosed herein can provide L70 lifetime of over 150,000 hours, or 17 years, using ENERGY STAR lifetime prediction methods. Similarly and according to the data and extrapolations above, the L70 lifetime for the packages described herein can be approximately 61,000 hours at 350 mA at 85° C.

Table 2.0 below comprises interpolated values of data for 85° C. as illustrated in FIG. 16B, and the interpolated values are designated by an asterisk (*).

TABLE 2.0

| Current (mA) | Ta (° C.) | L70 (hours) |
|---|---|---|
| 350 | 85 | 61,143 |
| 400 | 85 | 55,602* |
| 500 | 85 | 45,980* |
| 600 | 85 | 38,024* |
| 700 | 85 | 31,444* |
| 800 | 85 | 26,003* |
| 900 | 85 | 21,503* |
| 1000 | 85 | 17,782 |

One or more solid state emitter packages as described herein may be integrated into lighting apparatuses of varying types, including LCD devices and backlighting systems as described below. In one embodiment, an enclosure comprises an enclosed space and at least one solid state emitter package or lighting device as disclosed herein, wherein upon supply of current to a power line, the at least one lighting device illuminates at least one portion of the enclosed space. In another embodiment, a structure comprises a surface and at least one solid state emitter package or lighting device as disclosed herein, wherein upon supply of current to a power line, the lighting device illuminates at least one portion of the surface. In another embodiment, a solid state emitter package or lighting device as disclosed herein may be used to illuminate an area comprising at least one of the following: a swimming pool, a room, a warehouse, an indicator, a road, a vehicle, a road sign, a billboard, a ship, a toy, an electronic device, a household or industrial appliance, a boat, and aircraft, a stadium, a tree, a window, a yard, and a lamppost. In further embodiments, the solid state emitter package or lighting device as disclosed herein may be used for direct light, indirect light, backlighting applications, and/or lighting fixtures.

Backlighting With Optimized Metal-to-Metal Die Attach

FIG. 17 illustrates an expanded perspective view of a representative flat display panel system, generally designated 500. Embodiments described and illustrated herein can provide uniform backlighting for small or large area display panels greater or less than a dimension of 17" diagonal. Display panel system 500 can be combined with other electrical and/or mechanical elements to provide computer monitors, televisions, and/or other flat display panels. As used herein, "uniform" backlighting means than an ordinary viewer who views the display at a conventional viewing distance is not aware of any discrepancy or variation in backlighting intensity. In some embodiments, variations of less than about 25% can provide uniform intensity, whereas, in other embodiments variations of less than 5% can provide uniform intensity. Display panel system 500 can comprise square, rectangle, or any suitable shaped panels of any suitable dimension. Embodiments of display panels described herein can provide direct backlighting of flat panel LCDs.

FIG. 17 illustrates display panel system 500 comprising an illumination panel 502 and a display panel, or LCD panel 504. Illumination panel 502 can comprise a plurality of solid state emitters, or LEDs 506. In one aspect, illumination panel 502 can comprise a planar (i.e., two dimensional) array of LEDs 506 mounted either directly over illumination panel 502 or arranged in packages over illumination panel 502. LEDs 506 can be spaced apart from one another at a predetermined distance, or pitch P so as to provide substantially uniform backlighting of LCD panel 504. LEDs 506 can be packed in a random array, a grid array (as shown), a staggered array, or any suitable array. Uniform and/or non-uniform packing may be provided. Pitch P between adjacent LEDs 506 can allow for uniform backlighting of at least a portion of LCD panel 504. In one aspect, LEDs 506 can provide uniform backlighting over the entire LCD panel 504. A frame (not shown) can be disposed about illumination panel 502 and LCD panel 504 to hold the panels adjacent and either together or spaced apart with a gap disposed therebetween.

LCD panel 504 can comprise a flat display panel having planar array of LCD devices, or cells. In one aspect, LCD panel 504 can comprise a planar array of liquid crystal devices arranged into a matrix of pixels (not shown). An image can form on a front display surface 508 of LCD panel 504 when the liquid crystal devices are subjected to backlight illumination. To provide backlight illumination to LCD panel 504, the planar array of LEDs 506 comprising illumination panel 502 can be arranged into a matrix such that each LED 506 is arranged to provide illumination to a single LCD device or to a plurality of LCD devices thereby collectively defining specific images on display surface 508. Backlight LEDs 506 can be arranged to illuminate the entirety or a portion of LCD panel 504, the illumination passing through LCD panel 504 from a back surface 510 of the panel through the LCD pixels to the display panel 508. LCD panel 504 can comprise the back surface 510 parallel and opposing front surface 508 and a thickness disposed therebetween defined by the LCD devices, or cells. The thickness of LCD panel 504 can be any suitable dimension.

Optionally, one or more optical layers 512 may be disposed between illumination panel 502 and LCD panel 504. Optical layer 512 can comprise at least one layer or film such as polarizing films, light scattering films, light guide films or any suitable film capable of manipulating light emitted by illumination panel 502. In one aspect, optical layer 512 can comprise a diffuser that distributes light uniformly behind the viewing area. In one aspect, optical efficiency may be enhanced by direct backlighting such that the need for diffusing and/or optical films between illumination panel 502 and LCD panel 504 may be reduced or eliminated. In one aspect, optical layer can comprise an edge 511 along which one or more LEDs 506 may direct light. Optionally, the light could be directed along an edge of LCD panel as described in FIG. 18B.

FIGS. 18A and 18B illustrate different cross-sectional views of an unexpanded display panel 500 described and illustrated by FIG. 17. For illustration purposes, the figures illustrate LEDs 506 directing light toward optical layer 512, however, the LEDs 506 in each of FIGS. 18A and 18B could direct light toward LCD panel 504 instead. That is, in FIG. 18A optical layer 512 could be excluded, and in FIG. 18B, optical layer 512 could be replaced with LCD panel 504. The figures would be the same otherwise to include additional figures would be excessive.

FIG. 18A illustrates one or more LEDs 506 mounted over illumination panel 502 providing direct backlighting to LCD panel 504. LEDs 506 can be disposed adjacent each other spaced apart a pitch P in rows, columns, and/or a random array (FIG. 17). Pitch P can be the same dimension for LEDs 506 spaced apart between the rows and columns of the planar array, or the LEDs can be spaced apart in rows at a first pitch and spaced apart in columns at a second pitch. Alternatively, any suitable pitch P and variations of pitch can be used between the planar array of LEDs 506. FIG. 18A illustrates at least one optical layer or film 512 disposed between illumination panel 502 and LCD panel 504, however, such film is optional. LEDs 506 can provide backlighting directly to LCD panel 504. In one aspect, the planar array of LED devices 508 can be configured to transmit light directly to the planar array of LCD pixels comprising LCD panel 504 over a space, or gap, generally designated 514. Gap 514 can be disposed between illumination panel 502 and LCD panel 504, or optical film 512, and can define a space across which one or more individual light paths 516 can extend from the one or more LED devices 506. In one aspect, light paths 516 can extend perpendicular to the planar array of LEDs 506 and perpendicular to LCD panel 504. In other aspects, lights paths 516 can extend from an edge parallel LCD panel 504 or be reflected perpendicular LCD panel 504. That is, in some aspects, at least some of the LEDs 506 can be disposed within a periphery of the LCD panel 504.

Figure 21A:
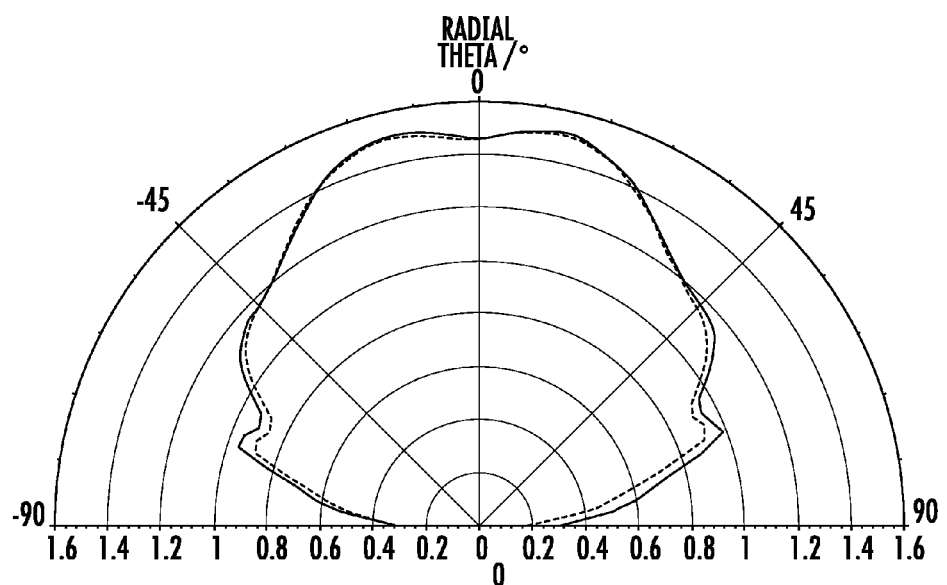
FIGS. 21A to 21C illustrate radiation patterns of solid state devices used in the backlighting systems according to the present subject matter.
Figure 21B:
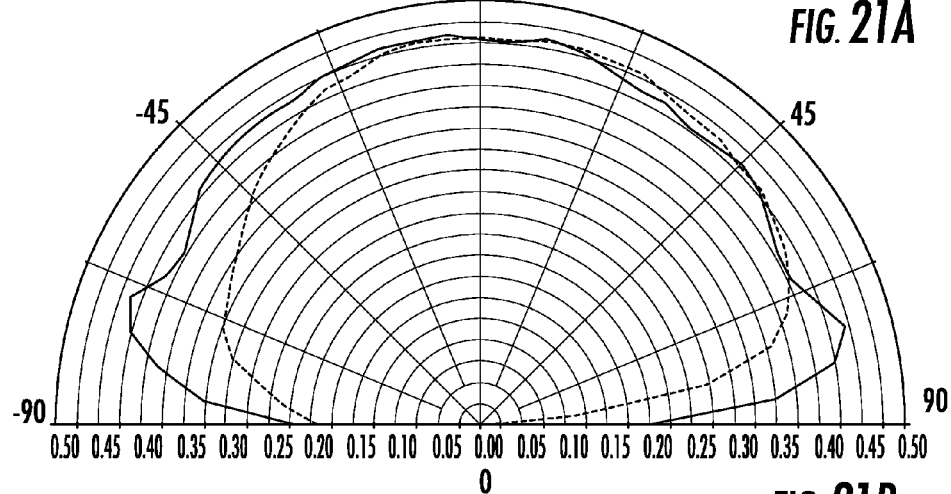
Figure 21C:
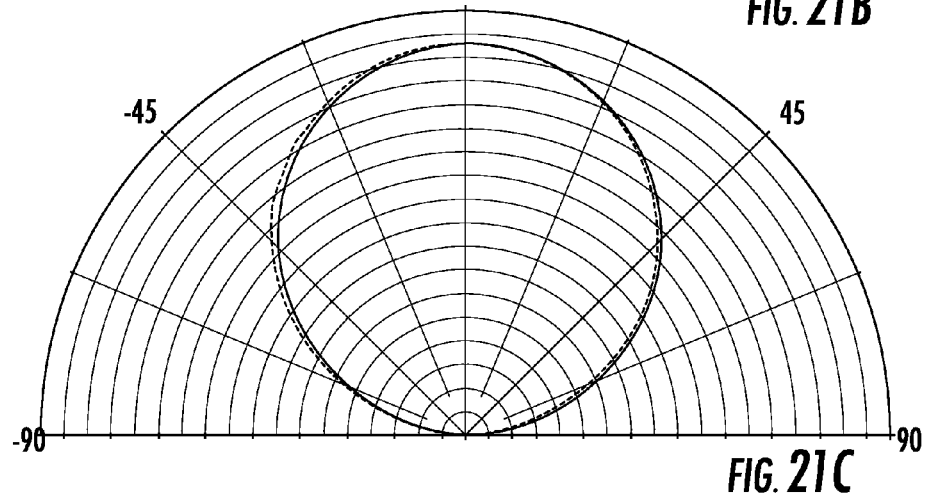

Still referring to FIG. 18A and in one aspect, each LED device 506 comprising the planar array of LEDs can emit light at an illumination angle θ that can conform to radiation patterns such as those described in FIGS. 21A to 21C. The edges of adjacent light paths 516 can just meet at a periphery 518, or slightly overlap depending on the pitch P at which adjacent LEDs 506 are spaced. When one or more LEDs 506 are spaced at the pitch P shown, adjacent light paths 516 can intersect, or touch, at periphery edges 518. If spaced closer together, individual light paths 516 can overlap. Different grids or arrangements of planar arrays of LEDs 506 can also affect the overlap and distribution of light paths 516. In one aspect, light paths 516 can intersect at periphery edges 518 and/or overlap to provide uniform backlighting illumination to LCD panel 504. FIG. 18 illustrates at least one column of the planar array of LEDs 506. Light paths 516 from respective LEDs 506 in adjacent columns and/or rows can intersect and/or overlap. LEDs 506 can also be configured for indirect backlighting of LCD panel 504, for example, LEDs 506 can be disposed around edges of illumination panel and indirectly reflect and illuminate LCD panel 504.

FIG. 18A further illustrates illumination panel 502 comprising a first surface 520 over which the one or more LEDs 506 can mount. Illumination panel 502 can comprise a second surface 522 parallel and opposing first surface 520. First surface 520 of illumination panel 502 can face optical film 512. In one aspect, first surface 520 of illumination panel 502 can face back surface 510 of LCD panel 504. Illumination panel 502 can comprise any suitable substrate over or onto which LEDs 506 may be mounted. For example, LCD panel 502 can comprise a circuit, printed circuit board (PCB), metal core printed circuit board (MCPCB) or any other suitable substrate. Top surface 520 of illumination panel 502 can comprise an electrically and/or thermally conductive surface. In one aspect, top surface 520 can comprise a metallic surface over which the one or more LEDs 506 can mount. In another aspect, top surface 520 can comprise a planar array of metallic surfaces over which the planar array of LEDs 506 can mount. One or more conductive traces (not shown) can connect the planar array of metallic surfaces such that electrical current or signal can flow to each of LEDs 506.

FIG. 18B illustrates another embodiment of panel display system 500. In this system, the arrows indicate light being directed from the one or more LEDs 506 toward opposing side edges 511 of optical layer 512. Optionally, the light can be directed toward an edge of LCD panel 504. This embodiment comprises an edge lighting panel display system where the one or more LEDs direct light towards edges, rather than directly behind, the panels of panel display system 500. LEDs 506 can be arranged in any suitable manner, such as in an array, and can be in any suitable LED package or outside of a package. LEDs 506 can be connected, to a structure that can be positioned directly against and in contact with side edges 511 or can be spaced apart from side edges 511. As shown in FIG. 18B, LEDs 506 are shown spaced apart for illustration purposes only.

Figure 19A:
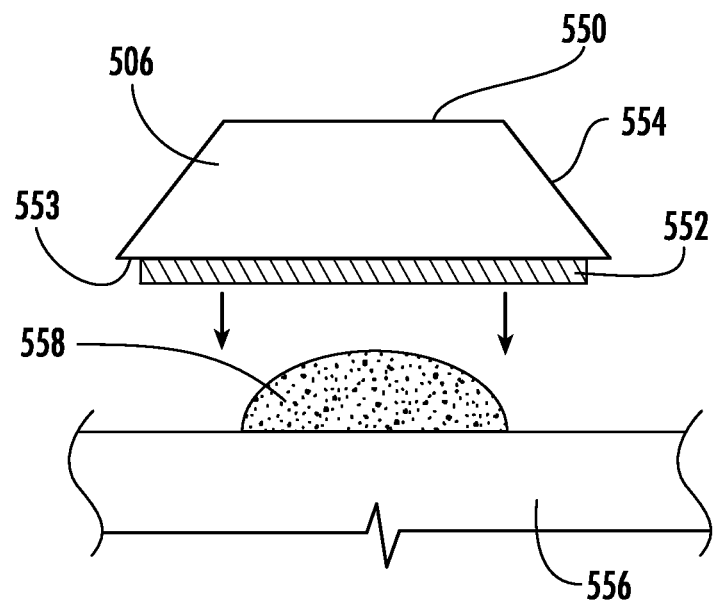
FIGS. 19A and 19B illustrate side views of die attach of a solid state emitting device used in backlighting systems according to the present subject matter.
Figure 19B:
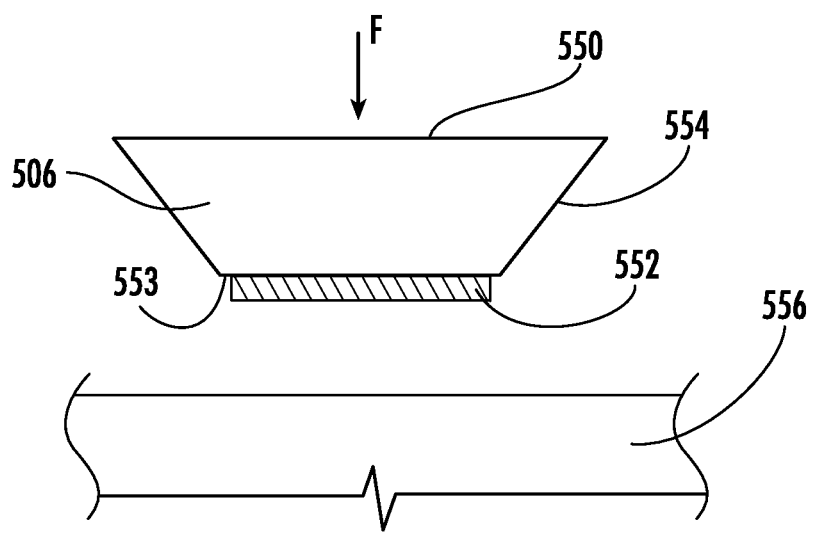

FIGS. 19A and 19B illustrate examples of metal-to-metal die attach methods used in backlighting applications according to the disclosure herein and not heretofore known. Such methods can comprise flux eutectic (e.g., flux-assisted eutectic), thermal compression, and non-eutectic metal-to-metal die attach (e.g., metal-assisted non-eutectic) methods. Notably, it is unexpected to use metal-to-metal die attach techniques in solid state device packages having molded plastic bodies. It is equally as unexpected to use such die attach methods or materials in backlighting applications and/or systems. This is at least partly due to both the cost and/or specialized equipment required to perform the metal-to-metal attach techniques. It is also unexpected because of the large number of LEDs 506 comprising the planar array formed over illumination panel 502. Metal-to-metal die attach methods can be tedious and require inert atmospheres in addition to accurate control of the amount of assist material dispensed and accurate heating profiles. It is not known and quite unexpected to use such metal-to-metal die attach methods in backlighting situations such as when attaching large quantities of LEDs. The metal-to-metal attachment methods can require dispensing just the right amount and type of assist material, for example, flux, and require precise control of reflow temperature profiles, and/or require thermal compression, all of which can be difficult to achieve when attempting to attach LEDs in a repeatable fashion in mass production. In this regard, consistency and repeatability are necessary to achieve long-lifetime results. If conditions are not correct, voiding in the metal die attach, or bonding layer can be too high, leading to encapsulation defects and/or high thermal resistance. Further, an incorrect reflow profile or atmosphere can lead to LED degradation. These difficulties are true regardless of LED or package size or geometry, with each case providing unique assembly problems. For example, small LED chips with correspondingly small die attach areas can have low voiding but weak die attach strength due in part to incomplete metal reflow. Conversely, large LED chips with correspondingly high die attach area can have high die shear strength but high voiding. Both are unsuitable for long-lifetime applications.

A robust substrate-to-source die attach process can be important to achieve low electrical resistance, low thermal resistance and good mechanical and electrical integrity. In one aspect, an illumination source, or LED, can comprise a metal die attach area and a substrate can comprise a metallic layer. Thus, the bond therebetween can be described as a metal-to-metal bond facilitated by a suitable die attach method. Metal die attach area can comprise, for example, an area of a metallic bonding layer disposed on a surface of the LED. A first metal-to-metal die attach method illustrated by FIG. 19 comprises an assisted (e.g., using flux, metal, or otherwise) eutectic or non-eutectic die attach method which can be used in backlighting applications. This method can be performed without application of an external force during the die attach process. One advantage of this method is that no squeeze-out of the die attach metal, or bonding layer, occurs. This can reduce the risk of forming a Schottky contact to the n-substrate of the device. Another robust meta-to-metal die attach method which can be used for backlighting applications comprises a thermal compression die attach method is used during the bonding process rather than an attach material. The advantage is similar in that that substantially little to no squeeze-out of the die attach metal occurs. In addition, no residue is left from the attach material, such as a flux or metal assist material. Even no-clean flux materials can leave behind a small portion of residue which may subsequently need cleaned with alcohol or other suitable solvent. In addition, the metal-to-metal bond formed when the bonding layer attaches over the external substrate can comprise a lower thermal resistance allowing the LED to resist detachment from the substrate over its operating lifetime.

FIGS. 19A and 19B are similar to FIGS. 15A and 15B, and the description of FIGS. 15A and 15B are equally applicable to FIGS. 19A and 19B as illustrated. LED 506 of FIG. 19 can comprise any size, shape, dimension, and/or structuring of LED. For example, LED 506 can comprise a substantially beveled design as illustrated in FIGS. 19A and 19B or it can comprise a straight-cut design. LED 506 can be vertically or horizontally structured such that zero, one, or greater than one bondpad is disposed on an upper surface 550 of the LED for electrically connecting to one or more electrical elements. LED 506 can be mounted such that the p-side, n-side, or each of p and n-sides of the LED are mounted over an external substrate, for example substrate 556. In one aspect, the LED 506 can be connected to a substrate 556 at a portion of the growth substrate or carrier substrate of the LED 506 such as previously discussed. FIGS. 19A and 19B illustrate LED 506 comprising the upper surface 550 opposite a bonding surface 553. Bonding surface 553 can comprise a die attach area comprising an area of bonding layer 552. In one aspect, upper surface 550 can comprise a smaller dimensional length and/or width than bonding layer 552. In one aspect, upper surface 550 can comprise a smaller surface area than a surface area of bonding layer 552. Lateral sides 554 can incline or slope between the upper surface 550 and bonding surface 553. In one aspect, bonding layer 552 can comprise any suitable metallic alloy not limited to Au, Sn, or metal alloy, for example, 80/20 Au/Sn as described earlier. In one aspect, bonding layer 552 can comprise a layer of Sn having any suitable thickness. In one aspect, bonding layer 552 can comprise a layer of Sn having a thickness greater than approximately 0 µm. In one aspect, bonding layer 552 can comprise a bonding layer equal to or greater than at least approximately 0.5 µm. In one aspect, bonding 552 can comprise a layer of Sn having a thickness of at least equal to or greater than approximately 2.0 µm.

FIGS. 19A and 19B further illustrates LED 506 mounted over a substrate 556. Substrate 556 can comprise a surface or layer of illumination panel 502 or a substrate 400 (FIGS. 15A, 15B) within an LED package, for example, thermal transfer material 70 within package 100 previously described. FIG. 19A illustrates a metal-to-metal die attach method utilizing an assist material 558 for facilitating the metal-to-metal bond. In one aspect, the metal-to-metal die attach method can comprise a eutectic or non-eutectic die attach method. In one aspect, a flux-assisted eutectic die attach method is used. In other aspects, a metal-assisted non-eutectic die attach method is used. Where a eutectic method is chosen, bonding layer 552 can comprise a metal alloy having a eutectic temperature which can attach to a metallic substrate 556. In one aspect, bonding layer 552 comprises 80/20 Au/Sn and attach material 558 can comprise an amount of flux material which can be dispensed over substrate 556. LED 506 can then be attached and/or mounted to substrate 556 upon appropriate heating of the bonding layer 552 to its eutectic temperature such that metallic atoms within the bonding layer atomically diffuse into metallic atoms of substrate 556. In one aspect, reflow heating techniques are used, the technique having distinct time and temperature profiles. As noted earlier a consideration when choosing a material for use in flux-assisted eutectic die attach can be the melting point $T_m$ of the LED bonding layer 552. A flux chosen for use can be liquid at room temperature or can require heating or melting to reach a melting point $T_m$. Any suitable size or type of chip can be attached using metal-to-metal techniques and/or materials described herein. For example, LED 506 can be attached such that the active, light-emitting layer is junction down or junction up. In one aspect, LED 506 can comprise a flip chip LED design.

Still referring to FIG. 19A, a non-eutectic metal-to-metal die attach method can be used which can also comprise an assist material 558, the assist material 558 comprising a metal or metallic material. In this aspect, bonding layer 552 can comprise a single metal or a metal alloy. For example, bonding layer 552 can comprise Au, Sn, or AuSn. In non-eutectic methods, the bonding layer does not need to reach or exceed a temperature, for example, a eutectic temperature. In this aspect, assist material 558 can comprise a metallic material to facilitate the metal-to-metal bonding. For example, assist material 558 can comprise AuSn paste or Ag epoxy. Any suitable metallic assist material 558 can be used. The metal of bonding layer 552 can attach to the metal of the assist material 558. The metal of the assist material 558 can also attach to the metal of substrate 556, for example an illumination panel 502 or LED package. In one aspect, a metal "sandwich" forms between bonding layer 552, assist material 558, and substrate 556 in non-eutectic metal-to-metal attach techniques where a metallic assist material 558 is used. Metal-assisted non-eutectic die attach methods can be tedious as flux-assisted methods, thus, it is also unexpected to use such methods when attaching LEDs 506 for backlighting applications. Metal-to-metal attachment using an assist material 558 can be hard to control and tedious when attempting to attach LEDs in a repeatable fashion in mass production over, for example, a backlighting panel. In this regard, it is unexpected to use flux-assisted or metal-assisted metal-to-metal die attach methods for backlighting applications.

Assist material 558 used in eutectic or non-eutectic metal-to-metal die attach methods can be placed using pin transfer or other precision dispense method, and the LED 506 can then be placed downward into the attach material 558. In one aspect, a no-clean flux assist material 558 can be dispensed onto substrate 556 via pin transfer. In other aspects, a AuSn paste or Ag epoxy metal assist material 558 can be dispensed onto substrate 556. Careful control of dispense volume of flux and/or metal attach material 558 can be important to minimize risk of movement LED 506 during reflow where a reflow heating techniques is used. For eutectic metal-to-metal techniques and upon placement of LED 506, substrate 556 can be heated to at least greater than the AuSn eutectic temperature using any suitable heating method to reflow or melt the AuSn metal bonding layer 552. The type of flux, the amount of flux used, and the reflow time and temperatures are important factors to control to optimize die attach results and for long term reliability of the attached LED. In one aspect, substrate 556 can be heated to a mounting temperature greater than a melting temperature and/or a eutectic temperature of bonding layer 552. In one aspect, substrate 556 can be heated to a temperature of at least approximately 10° C. or greater than the melting temperature, or eutectic temperature of the bonding layer 552 of LED 506. In one aspect, substrate 556 can be heated to at least approximately 20° C. or greater than the melting temperature of bonding layer 552. In addition, LED 506 should be placed through the flux and in contact with the substrate prior to reflow. If too much flux is used, inadequate melting of bonding layer 552 may result which would cause an inadequate bond between LED 506 and underlying substrate 556 having a large number of voids and potentially leading to partial or full detachment of the LED 506 during operation (i.e. illumination). Flux-assisted eutectic die attach can result in a strong, robust die attach between LED 506 and substrate 556. A stronger bond between LED 506 and substrate 556 with improved die shear strengths are expected. Improved thermal resistance at the bond (i.e., the LED/substrate interface) is also expected, which can allow LED 506 to stay cooler during operation, thereby providing improved color and lumen stability over the operating lifetime.

Defects can occur during die attach of a LED 506 to an external substrate, wherein a conductive path can form from the edge of the silicon-carbide LED substrate to the bonding layer 552 of the LED. The distance between the LED substrate (which can be silicon carbide) and bonding layer 552 can be approximately 5 microns. If residual die bonding layer material (i.e., AuSn) extends up the lateral side 556 and contacts the substrate (e.g., squeeze out) then the LED can form an electrical short and fail to illuminate or it could potentially leak electrical current being less energy efficient and less bright. The flux-assisted and metal-assisted die attach processes can minimize the likelihood of such defects occurring during die attach by minimizing squeeze out of the metal bonding layer 552. Conventional die attach methods including silicone or non-metallic epoxies can increase the amount of material at the bonding interface and increase the potential for defects caused by squeeze out Assisted eutectic or non-eutectic and thermal compression metal-to metal die attach methods for die attach according to the present subject matter also can utilize an inert atmosphere, such as a nitrogen atmosphere, to reduce oxygen gas ($O_2$) levels and also allow gravity to apply a downward force on LED 506. This can reduce the amount of oxidation at the metal-to-metal bond between bonding layer 552 and underlying substrate 556.

FIG. 19B illustrates a metal-to-metal die attach method in a backlighting application wherein an assist material 558 is not utilized. In this method, an external force F can compress LED 506 into substrate 556, for example an illumination panel used in backlighting. Force F can be delivered in a heated environment thus, this technique can be deemed as a thermal compression technique. Bonding layer 552 can comprise any suitable metal. In one aspect, bonding layer 552 can comprise a substantially Sn bonding layer 552. Thermal compression can facilitate a metal-to-metal die attach method which can in turn reduce metal squeeze out of the bonding layer 552 which can form Shottky or Shunt defects and allow subsequent leakage of current and other various and related problems. During thermal compression die attach, the substrate can be heated to at mounting temperature of at least greater than approximately the melting temperature of the bonding layer 552. In one aspect the substrate can be heated to a mounting temperature of at least approximately 10° C. above the melting temperature of the bonding layer. In one aspect, the substrate can be heated to a mounting temperature of at least approximately 20° C. above the melting temperature of the bonding layer 552. The bonding time can be approximately 300 msec and the bonding force F can comprise approximately 50+/-10 grams (g). Predetermined settings can be important for this method, including adequate preheat, bonding temperature, bonding time, and bonding force. As such, a thermal compression metal-to-metal die attach technique is unexpected in backlighting applications.

LEDs 506 can comprise an arrangement or planar arrays of red, green, and blue LED devices configured to emit light that appears as a pixel of white light in operation. Sizes of red, green, and blue LEDs can be selected to meet a desired brightness and/or intensity balancing level. Any configuration of the red, green, and blue LEDs can be used. LED packages and/or LEDs utilizing metal-to-metal die attach methods as described herein can be used in backlighting systems and any suitable display panel system 500. For example and without limitation, LED packages and/or LEDs used in backlighting and display panel systems can offer light output of up to 122 lumens at 300 mA in cool white (CW), and up to 100 lumens at 300 mA in warm white (WW) color points. For example, LED packages and/or LEDs disclosed herein can be used in lighting fixtures comprising fixtures used in display panel systems offering a minimum CRI for CW color points of 65 CRI. LED packages and/or LEDs disclosed herein can be used in lighting fixtures comprising fixtures used in display panel systems offering a minimum CRI for CW color points of 75 CRI which corresponds to a range of 5,000 K to 8,300 K CCT. LED packages and/or LEDs disclosed herein for use in display panel systems can also offer, for example, a minimum CRI for WW color points of 80 CRI which corresponds to a range of 2,600K to 3,700K CCT. Such LED packages and/or LEDs can be used for both standard and high voltage configurations.

Figure 20A:
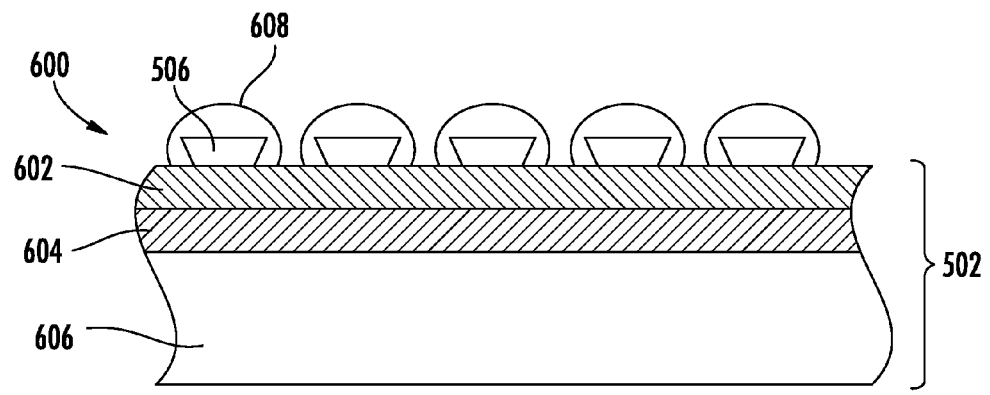
FIGS. 20A to 20C illustrate side views of an illumination panel used in a backlighting system according to the present subject matter.
Figure 20B:
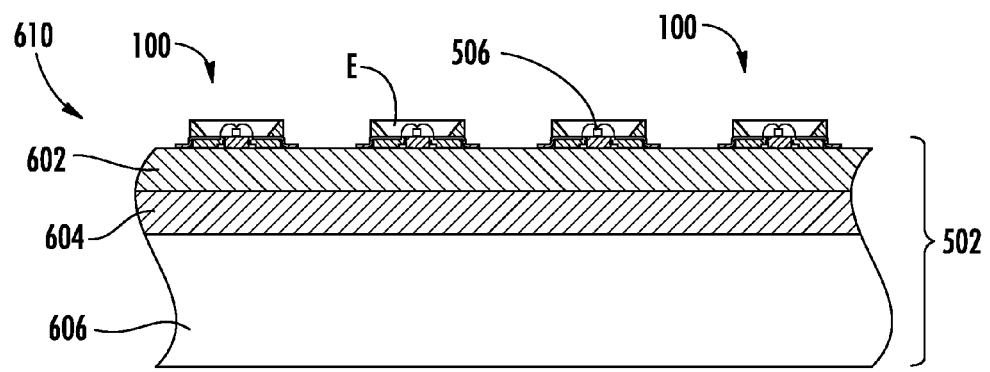
Figure 20C:
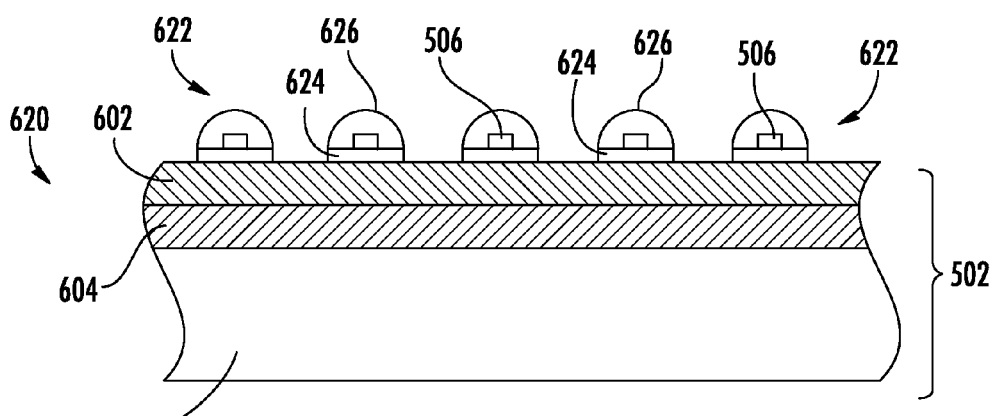

FIGS. 20A to 20C illustrate various configurations for die attach used in backlighting applications. FIG. 20A illustrates a first configuration 600 in which one or more LEDs 506 can be attached over illumination panel 502. Illumination panel can comprise a fully integrated, solid electrically and thermally conductive panel, or in the alternative it can comprise one or more layers. In one aspect, illumination panel 502 can comprise a MCPCB having an electrically conductive layer 602 to which LEDs 506 can mount. One or more electrically insulating but thermally conductive layers 604 can be disposed adjacent and under electrically conductive layer 602. In one aspect, thermally conductive layer 604 comprises a dielectric layer. A core layer 606 can be disposed adjacent and under thermally conductive layer 604. In one aspect, core layer 606 can comprise a metal core substantially formed wholly of aluminum or copper. FIG. 20A illustrates LEDs 506 directly mounted over illumination panel 502 which can be referred to as a "chip on board" configuration. A lens or dome 608 can be placed, dispensed, or otherwise formed over LEDs 506 individually or as a group. In one aspect, dome 608 can comprise a layer of encapsulant dispensed over LED, the encapsulant containing one or more phosphors for emitting light of a desired wavelength. LEDs 506 can comprise a beveled design having a bonding layer area that can be smaller than an area of the upper surface or vice versa. Beveled chips may reflect more light than conventional LED chip designs because of the beveled surfaces.

FIG. 20B illustrates one or more LEDs arranged in packages over illumination panel 502 in a second arrangement or configuration generally designated 610. At least one LED can be arranged within package, however, multiple LEDs can also be mounted. In one aspect, previously described emitter packages 100 can be arranged over illumination panel 502. In one aspect, emitter packages 100 can comprise a body structure 10 formed using optimized plastic materials previously described. In another aspect, emitter packages 100 can comprise a body structure 10 formed using any suitable plastic, non-plastic, silicone, or ceramic material. Packages can comprise a cavity as illustrated in FIG. 20B, or not in a cavity as illustrated in FIG. 20C. Packages can further comprise a lens, or dome as illustrated in FIG. 20C or not have a lens as in FIG. 20B. LEDs 506 can be attached within packages 100 using assisted eutectic or non-eutectic die attach methods, or thermal compression methods described herein. Assisted methods can comprise flux-assisted eutectic die attach and metal-assisted non-eutectic die attach methods. Encapsulant E can be dispensed or otherwise placed in a package 100 to an amount even with the body structure, or to an amount such that a concave or convex surface forms. Encapsulant E can comprise one or more phosphors for emitting light of a desired wavelength.

FIG. 20C illustrates a third arrangement or configuration 620 wherein a second type of LED package, generally designated 622 that can be disposed over illumination panel 502. In one aspect, LED package 622 can comprise a plastic, silicone, aluminum, or ceramic body 624 within which an LED 506 can be die attached using a using assisted eutectic or non-eutectic die attach methods, or thermal compression methods described herein. Assisted methods can comprise flux-assisted eutectic die attach and metal-assisted non-eutectic die attach methods. In one aspect, LED package 622 can comprise a dome or lens 626 disposed over each of LED 506 and body 624. For illustration purposes, two LED packages have been illustrated as disposed over illumination panel 502. In actuality, any suitable LED package or LED chip may be disposed over illumination panel 502.

FIGS. 21A to 21C illustrate radiation or "far-field" patterns of LEDs 506 comprising a chip-on-board configuration or within packages disposed over illumination panel. FIGS. 21A and 21B illustrate radiation patterns of un-encapsulated, or bare LEDs used without a dome or lens. In one aspect, the illumination angle θ illustrated in FIG. 18A can conform to the patterns illustrated in FIGS. 21A and 21B, and can intersect and/or overlap with patterns of adjacent LEDs. In one aspect, the radiation patterns illustrated by FIGS. 21A and 21B can comprise a substantially uniform curved path when viewed at less than +/−45 degrees. Radiation patterns can be manipulated by placement of a lens, dome, encapsulant or any other suitable reflective covering over a LED. In one aspect, radiation patterns can be manipulated by lenses and/or domes such as illustrated in FIG. 20A such that a uniform radiation pattern can be achieved. In one aspect, the uniform radiation pattern illustrated by FIG. 21C can be achieved by using a lens or dome such that light is substantially uniform about +/−90 degree viewing angles.

While the subject matter has been has been described herein in reference to specific aspects, features and illustrative embodiments of the subject matter, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Correspondingly, the subject matter as hereinafter claimed is intended to be broadly construed and interpreted, as including all such variations, modifications and alternative embodiments, within the scope of this disclosure.

What is claimed is:

1. A backlighting device for use with a display panel, the backlighting device comprising:
   one or more light emitting diodes (LEDs) for backlighting a display panel, the one or more LEDs attached to a substrate by eutectic die attach, by thermal compression die attach, or by non-eutectic metal-to-metal die attach; and
   the one or more LEDs comprising an array of LEDs operable for providing substantially uniform illumination to the display panel.

2. The device according to claim 1, wherein eutectic die attach comprises flux eutectic die attach.

3. The device according to claim 1, wherein non-eutectic die attach comprises a metal-assist.

4. The device according to claim 3, wherein the metal-assist comprises AuSn paste or Ag epoxy.

5. The device according to claim 1, wherein the substrate comprises an illumination panel disposed behind the display panel.

6. The device according to claim 1, wherein the substrate comprises a mounting surface within an LED package.

7. The device according to claim 1, wherein the one or more LEDs comprises a substantially vertical side disposed between an upper surface and a bonding surface.

8. The device according to claim 1, wherein the one or more LEDs comprises a beveled side inclined between an upper surface and a bonding surface.

9. The device according to claim 8, wherein the upper surface comprises a first surface area and the bonding surface comprises a second surface area.

10. The device according to claim 9, wherein the first surface area is larger than the second surface area.

11. The device according to claim 9, wherein the first surface area is smaller than the second surface area.

12. The device according to claim 1, wherein the one or more LEDs comprise a plurality of red, green, and blue LEDs.

13. The device according to claim 5, wherein at least one optical layer is disposed between the illumination panel and the LCD panel.

14. The device according to claim 1, wherein a bonding surface of the LEDs attaches to the substrate, the bonding surface comprising a layer of gold/tin (Au/Sn).

15. The device according to claim 14, wherein the bonding surface comprises a layer 80/20 AuSn.

16. The device according to claim 1, wherein a bonding surface of the LEDs attaches to the substrate, the bonding surface comprising a layer of tin (Sn).

17. The device according to claim 16, wherein the bonding surface comprises a layer having a thickness equal to or at least greater than approximately 0.5 μm Sn.

18. A backlighting device for use with a display panel, the backlighting device comprising:
one or more light emitting diodes (LEDs) for backlighting a display panel, the one or more LEDs attached to a substrate at a mounting temperature of approximately 280° Celsius (° C.) or greater;
the one or more LEDs operable for providing substantially uniform illumination to the display panel; and
the device comprising a minimum of approximately 65 CRI for Cool White (CW) color points or a minimum of approximately 80 CRI for Warm White (WW) color points.

19. The device according to claim 18, wherein the one or more LEDs attach to a substrate by eutectic die attach, by thermal compression die attach, or by non-eutectic metal-to-metal die attach.

20. The device according to claim 19, wherein eutectic die attach comprises flux eutectic die attach.

21. The device according to claim 19, wherein non-eutectic die attach comprises a metal-assist.

22. The device according to claim 21, wherein the metal-assist comprises AuSn paste or Ag epoxy.

23. The device according to claim 18, wherein the substrate comprises an illumination panel disposed behind the display panel.

24. The device according to claim 18, wherein the substrate comprises a mounting surface within an LED package.

25. The device according to claim 18, wherein the one or more LEDs comprises an array of LEDs.

26. The device according to claim 18, wherein the one or more LEDs comprises a beveled side inclined between an upper surface and a bonding surface.

27. The device according to claim 18, wherein the one or more LEDs comprises a substantially vertical side disposed between an upper surface and a bonding surface.

28. The device according to claim 26, wherein the upper surface comprises a first surface area and the bonding surface comprises a second surface area.

29. The device according to claim 28, wherein the first surface area is larger than the second surface area.

30. The device according to claim 28, wherein the first surface area is smaller than the second surface area.

31. The device according to claim 18, wherein the one or more LEDs comprise a plurality of red, green, and blue LEDs.

32. The device according to claim 23, wherein at least one optical layer is disposed between the illumination panel and the display panel.

33. The device according to claim 18, wherein a bonding surface of the LEDs attaches to the substrate, the bonding surface comprising a layer of gold/tin (Au/Sn).

34. The device according to claim 33, wherein the bonding surface comprises a layer 80/20 AuSn.

35. The device according to claim 18, wherein a bonding surface of the LEDs attaches to the substrate, the bonding surface comprising a layer of tin (Sn).

36. The device according to claim 35, wherein the bonding surface comprises a layer having a thickness equal to or at least greater than approximately 0.5 μm Sn.

37. A backlighting system comprising:
a display panel for displaying an image;
an illumination panel comprising one or more light emitting diodes (LEDs) attached to a substrate;
the one or more LEDs attached to the substrate by eutectic die attach, thermal compression die attach, or by non-eutectic metal-to-metal die attach;
the one or more LEDs operable for providing substantially uniform illumination to the display panel; and
the system comprising a minimum of approximately 65 CRI for Cool White (CW) color points or a minimum of approximately 80 CRI for Warm White (WW) color points.

38. The system according to claim 37, wherein eutectic die attach comprises flux eutectic die attach.

39. The system according to claim 37, wherein non-eutectic die attach comprises a metal-assist.

40. The system according to claim 39, wherein the metal-assist comprises AuSn paste or Ag epoxy.

41. The system according to claim 37, wherein the substrate comprises the illumination panel.

42. The system according to claim 37, wherein the substrate comprises a mounting surface within an LED package.

43. The system according to claim 41, wherein the illumination panel comprises an array of LEDs.

44. The system according to claim 37, wherein the one or more LEDs comprise a beveled side inclined between an upper surface and a bonding surface.

45. The system according to claim 37, wherein the one or more LEDs comprises a substantially vertical side disposed between an upper surface and a bonding surface.

46. The system according to claim 44, wherein the upper surface comprises a first surface area and the bonding surface comprises a second surface area.

47. The system according to claim 46, wherein the first surface area is larger than the second surface area.

48. The system according to claim 37, wherein the first surface area is smaller than the second surface area.

49. The system according to claim 37, wherein the one or more LEDs comprise a plurality of red, green, and blue LEDs.

50. The system according to claim 37, wherein at least one optical film is disposed between the illumination panel and the display panel.

51. The system according to claim 37, wherein a bonding surface of the LEDs attaches to the substrate, the bonding surface comprising a layer of gold/tin (Au/Sn).

52. The system according to claim 51, wherein the bonding surface comprises a layer 80/20 AuSn.

53. The system according to claim 37, wherein a bonding surface of the LEDs attaches to the substrate, the bonding surface comprising a layer of tin (Sn).

54. The system according to claim 53, wherein the bonding surface comprises a layer having a thickness equal to or at least greater than approximately 0.5 μm Sn.

55. A backlighting system comprising:
a display panel for displaying an image;
an illumination panel comprising an array of light emitting diodes (LEDs) attached to a substrate;
the array of LEDs attached to the substrate at a mounting temperature greater than a melting temperature of a bonding layer of the LEDs; and
the array of LEDs operable for providing substantially uniform illumination to the display panel.

56. The system according to claim 55, wherein the array of LEDs is attached to the substrate at a mounting temperature of at least approximately 10° C. or greater than a melting temperature of a bonding layer of the LEDs.

57. The system according to claim 55, wherein the array of LEDs is attached to the substrate at a mounting temperature of at least approximately 20° C. or greater than a melting temperature of a bonding layer of the LEDs.

58. The system according to claim 55, wherein the substrate comprises the illumination panel.

59. The system according to claim 55, wherein the substrate comprises a mounting surface within an LED package.

60. The system according to claim 55, wherein each LED of the array of LEDs comprises a beveled side inclined between an upper surface and a bonding surface.

61. The system according to claim 55, wherein each LED of the array of LEDs comprises a substantially vertical side disposed between an upper surface and a bonding surface.

62. The system according to claim 60, wherein the upper surface comprises a first surface area and the bonding surface comprises a second surface area.

63. The system according to claim 62, wherein the first surface area is larger than the second surface area.

64. The system according to claim 62, wherein the first surface area is smaller than the second surface area.

65. The system according to claim 55, wherein the array of LEDs comprise a plurality of red, green, and blue LEDs.

66. The system according to claim 55, wherein at least one optical layer is disposed between the illumination panel and the display panel.

67. The system according to claim 55, wherein a bonding surface of the LEDs attaches to the substrate, the bonding surface comprising a layer of gold/tin (Au/Sn).

68. The system according to claim 67, wherein the bonding surface comprises a layer 80/20 AuSn.

69. The system according to claim 55, wherein a bonding surface of the LEDs attaches to the substrate, the bonding surface comprising a layer of tin (Sn).

70. The system according to claim 67, wherein the bonding surface comprises a layer having a thickness equal to or at least greater than approximately 0.5 μm Sn.

71. A method for backlighting a display panel, the method comprising:
providing a backlighting device comprising:
one or more light emitting diodes (LEDs) for backlighting a display panel, the one or more LEDs attached to a substrate by eutectic die attach, thermal compression die attach, or by non-eutectic metal-to-metal die attach; and
the one or more LEDs operable for providing substantially uniform illumination to the display panel; and
positioning the one or more LEDs with respect to the display panel for providing substantially uniform backlighting illumination to the display panel, wherein positioning the one or more LEDs comprises positioning the LEDs spaced apart a gap from the display panel.

72. The method according to claim 71, providing a backlighting device comprises the one or more LEDs attached to a substrate by eutectic die attach comprising a flux eutectic die attach.

73. The method according to claim 71, providing a backlighting device comprises the one or more LEDs attached to a substrate by non-eutectic die attach comprising a metal-assist die attach.

74. The method according to claim 73, wherein the metal-assist die attach comprises AuSn paste or Ag epoxy.

75. The method of claim 71, wherein positioning the one or more LEDs comprises positioning the LEDs directly behind the display panel.

76. The method of claim 71, wherein positioning the one or more LEDs comprises positioning the LEDs about a side edge of the display panel.

77. The method of claim 71, wherein the one or more LEDs are attached directly to the substrate, and the substrate comprises an illumination panel.

78. The method of claim 71, wherein the one or more LEDs are attached directly to the substrate, and the substrate comprises an LED package disposed over an illumination panel.

79. A method for backlighting a display panel, the method comprising:
providing a backlighting device comprising:
one or more light emitting diodes (LEDs) for backlighting a display panel, the one or more LEDs attached to a substrate at a mounting temperature of approximately 280° Celsius (° C.) or greater; and
the one or more LEDs operable for providing substantially uniform illumination to the display panel; and
positioning the one or more LEDs with respect to the display panel for providing substantially uniform backlighting illumination to the display panel.

80. The method of claim 79, wherein positioning the one or more LEDs comprises positioning the LEDs directly behind the display panel.

81. The method of claim 79, wherein positioning the one or more LEDs comprises positioning the LEDs about an edge of the display panel.

82. The method of claim 79, wherein positioning the one or more LEDs comprises positioning the LEDs spaced apart by a gap from the display panel.

83. The method of claim 79, wherein the one or more LEDs are attached directly to the substrate, and the substrate comprises an illumination panel.

84. The method of claim 79, wherein the one or more LEDs are attached directly to the substrate, and the substrate comprises an LED package disposed over an illumination panel.

85. A method for backlighting a display panel, the method comprising:
provisioning a backlighting system comprising:
a display panel for displaying an image;
an illumination panel comprising one or more light emitting diodes (LEDs) attached to a substrate;
the one or more LEDs attached to the substrate by eutectic die attach, thermal compression die attach, or by non-eutectic metal-to-metal die attach; and
the one or more LEDs operable for providing substantially uniform illumination to the display panel; and
positioning the one or more LEDs with respect to the display panel for providing substantially uniform backlighting illumination to the display panel.

86. The method of claim 85, wherein positioning the one or more LEDs comprises positioning the LEDs directly behind the display panel.

87. The method of claim 85, wherein positioning the one or more LEDs comprises positioning the LEDs about an edge of the display panel.

88. The method of claim 85, wherein positioning the one or more LEDs comprises positioning the LEDs spaced apart a gap from the display panel.

89. The method of claim 85, wherein the one or more LEDs are attached directly to the substrate, and the substrate comprises an illumination panel.

90. The method of claim 85, wherein the one or more LEDs are attached directly to the substrate, and the substrate comprises an LED package disposed over an illumination panel.

91. The method according to claim 85, providing a backlighting system comprises the one or more LEDs attached to a substrate by eutectic die attach comprising a flux eutectic die attach.

92. The method according to claim 85, providing a backlighting system comprises the one or more LEDs attached to a substrate by non-eutectic die attach comprising a metal-assist die attach.

93. The method according to claim 92, wherein the metal-assist die attach comprises AuSn paste or Ag epoxy.

94. A method for backlighting a display panel, the method comprising:
providing a backlighting system comprising:
a display panel for displaying an image;
an illumination panel comprising one or more light emitting diodes (LEDs) attached to a substrate;
the one or more LEDs attached to the substrate at a mounting temperature greater than a melting temperature of a bonding layer of the LEDs;
the one or more LEDs operable for providing substantially uniform illumination to the display panel; and
positioning the one or more LEDs with respect to the display panel for providing substantially uniform backlighting illumination to the display panel.

95. The method of claim 94, wherein providing a backlighting system comprises the one or more LEDs attached to the substrate at a mounting temperature greater than at least approximately 10° Celsius (° C.).

96. The method of claim 94, wherein providing a backlighting system comprises the one or more LEDs attached to the substrate at a mounting temperature greater than at least approximately 20'Celsius (° C.).

97. The method of claim 94, wherein positioning the one or more LEDs comprises positioning the LEDs directly behind the display panel.

98. The method of claim 94, wherein positioning the one or more LEDs comprises positioning the LEDs about an edge of the display panel.

99. The method of claim 94, wherein positioning the one or more LEDs comprises positioning the LEDs spaced apart by a gap from the display panel.

100. The method of claim 94, wherein the one or more LEDs are attached directly to the substrate, and the substrate comprises an illumination panel.

101. The method of claim 94, wherein the one or more LEDs are attached directly to the substrate, and the substrate comprises an LED package disposed over an illumination panel.

102. The device according to claim 1, comprising a minimum of approximately 65 CRI for Cool White (CW) color points or a minimum of approximately 80 CRI for Warm White (WW) color points.

103. The system according to claim 55, comprising a minimum of approximately 65 CRI for Cool White (CW) color points or a minimum of approximately 80 CRI for Warm White (WW) color points.

104. A light emitting device for a lighting fixture, the light emitting device comprising:
a package for housing one or more light emitting diodes (LEDs);
the one or more LEDs attached to a substrate of the package by eutectic die attach, thermal compression die attach, or by non-eutectic metal-to-metal die attach; and
the light emitting device comprising a minimum of approximately 65 CRI for Cool White (CW) color points or a minimum of approximately 80 CRI for Warm White (WW) color points.

105. The light emitting device of claim 104, wherein the lighting fixture comprises a lighting fixture for a panel display system.

106. The light emitting device of claim 104, wherein the panel display system comprises a backlighting system.

107. The light emitting device of claim 104, wherein the non-eutectic metal-to-metal die attach comprises metal-assisted die attach using gold/tin (Au/Sn) paste or silver (Ag) epoxy.

108. The light emitting device of claim 104, wherein the package comprises a lens.

109. The light emitting device of claim 104, wherein the one or more LEDs comprise at least two LEDs.

110. The light emitting device of claim 104, wherein the one or more LEDs comprise beveled lateral sides.

111. The light emitting device of claim 104, wherein the one or more LEDS comprise straight cut lateral sides.

112. The light emitting device of claim 104, wherein the substrate comprises a thermal transfer element.

113. The light emitting device of claim 104, wherein the one or more LEDs are electrically connected in parallel, in series, or a combination of both.

114. The light emitting device of claim 104, wherein the eutectic die attach comprises flux eutectic die attach.

115. A light emitting device for a lighting fixture, the light emitting device comprising:
a package for housing one or more light emitting diodes (LEDs);
the one or more LEDs comprising a bonding surface disposed opposite an upper surface of the one or more LEDS, an inclined lateral side extending between the bonding surface and the upper surface, and the bonding surface comprising a bonding layer attached to a mounting substrate of the package by eutectic die attach, thermal compression die attach, or by non-eutectic metal-to-metal die attach;

wherein the bonding surface the one or more LEDs comprises at least a portion of a substrate, a p-side, a n-side, or each of the p- and n-sides of the LED.

116. The light emitting device of claim 115, wherein eutectic die attach comprises flux eutectic die attach.

117. The light emitting device of claim 115, wherein the non-eutectic metal-to-metal die attach comprises metal-assisted die attach using gold/tin (Au/Sn) paste or silver (Ag) epoxy.

118. The light emitting device of claim 115, wherein the substrate comprises a growth substrate or a carrier substrate.

119. The light emitting device of claim 115, wherein the package comprises a lens.

120. The light emitting device of claim 115, wherein the one or more LEDs comprise at least two LEDs.

121. The light emitting device of claim 111, where the lateral sides are inclined between the bonding surface and the upper surface such that the upper surface has an upper surface area which is larger than a surface area of the bonding surface.

122. The light emitting device of claim 111, where the lateral sides are inclined between the bonding surface and the upper surface such that the upper surface has an upper surface area which is smaller than a surface area of the bonding surface.

123. The light emitting device of claim 111, wherein the mounting substrate comprises a thermal transfer element.

124. The light emitting device of claim 111, wherein the package defines a cavity in which the one or more LEDs are disposed.

125. The light emitting device of claim 111, wherein the one or more LEDS comprise substantially vertical lateral sides.

126. The light emitting device according to claim 111, comprising a minimum of approximately 65 CRI for Cool White (CW) color points or a minimum of approximately 80 CRI for Warm White (WW) color points.

* * * * *